US012795940B2

(12) United States Patent
Lee et al.

(10) Patent No.: US 12,795,940 B2
(45) Date of Patent: Nov. 10, 2026

(54) FERROELECTRIC NON-VOLATILE MEMORY WITH AN OXIDE INSERTION LAYER BETWEEN AN ELECTRON BARRIER LAYER AND A METAL GLUE LAYER

(71) Applicant: Taiwan Semiconductor Manufacturing Company, Ltd., Hsinchu (TW)

(72) Inventors: Ya-Ling Lee, Hsinchu (TW); I-Cheng Chang, Hsinchu (TW); Yen-Chieh Huang, Changhua County (TW); I-Chee Lee, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 445 days.

(21) Appl. No.: 18/466,538

(22) Filed: Sep. 13, 2023

(65) Prior Publication Data

US 2025/0089265 A1 Mar. 13, 2025

(51) Int. Cl.

| | |
|---|---|
| ***H10B 51/30*** | (2023.01) |
| ***H10D 30/01*** | (2025.01) |
| ***H10D 30/69*** | (2025.01) |
| ***H10D 62/13*** | (2025.01) |
| ***H10D 64/01*** | (2025.01) |
| ***H10D 64/68*** | (2025.01) |

(52) U.S. Cl.

CPC ......... *H10B 51/30* (2023.02); *H10D 30/0415* (2025.01); *H10D 30/701* (2025.01); *H10D 62/151* (2025.01); *H10D 64/033* (2025.01); *H10D 64/689* (2025.01)

(58) Field of Classification Search

CPC .. H10B 51/30; H10D 30/0415; H10D 30/701; H10D 62/151; H10D 30/601; H10D 30/6713; H10D 64/033; H10D 64/689

See application file for complete search history.

(56) References Cited

U.S. PATENT DOCUMENTS

| | | | | |
|---|---|---|---|---|
| 2020/0161440 | A1 * | 5/2020 | Jhaveri | H10D 30/0243 |
| 2020/0411692 | A1 * | 12/2020 | Dewey | H10D 30/6755 |
| 2022/0285519 | A1 * | 9/2022 | Huang | H10B 51/20 |
| 2023/0029955 | A1 * | 2/2023 | Murray | H10D 30/0316 |

* cited by examiner

*Primary Examiner* — Chad M Dicke
*Assistant Examiner* — Jeremy Daniel Watts
(74) *Attorney, Agent, or Firm* — Harrity & Harrity, LLP

(57) ABSTRACT

A ferroelectric random access memory (FeRAM) cell may include an oxide insertion layer between the electron barrier layer and the metal glue layer of the source/drain regions of the FeRAM cell. The oxide insertion layer may improve the thermal stability of the electron barrier layer and minimize or prevent dissociation and/or out-diffusion of the electron barrier layer at high processing temperatures. Thus, the oxide insertion layer may enable the metal glue layer to be formed over the electron barrier layer with low surface roughness, which may enable increased adhesion between the metal glue layer and the source/drain electrodes of the source/drain regions. In this way, the oxide insertion layer may enable low electrical resistance to be achieved for the FeRAM cell and/or may reduce the likelihood of failures in the FeRAM cell, among other examples.

20 Claims, 32 Drawing Sheets

FERROELECTRIC NON-VOLATILE MEMORY WITH AN OXIDE INSERTION LAYER BETWEEN AN ELECTRON BARRIER LAYER AND A METAL GLUE LAYER

BACKGROUND

A ferroelectric random access memory (FeRAM) cell is a type of random-access memory cell that utilizes a ferroelectric field effect transistor (FeFET) that includes a ferroelectric (FE) layer to selectively store information based on polarization of the ferroelectric layer. For example, a first voltage may be applied to a gate structure of the FeFET to cause the ferroelectric layer to be polarized in a first polarization configuration corresponding to a programmed state of the FeRAM cell, and a second voltage may be applied to the gate structure to cause the ferroelectric layer to be polarized in a second polarization configuration corresponding to an erased state of the FeRAM cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
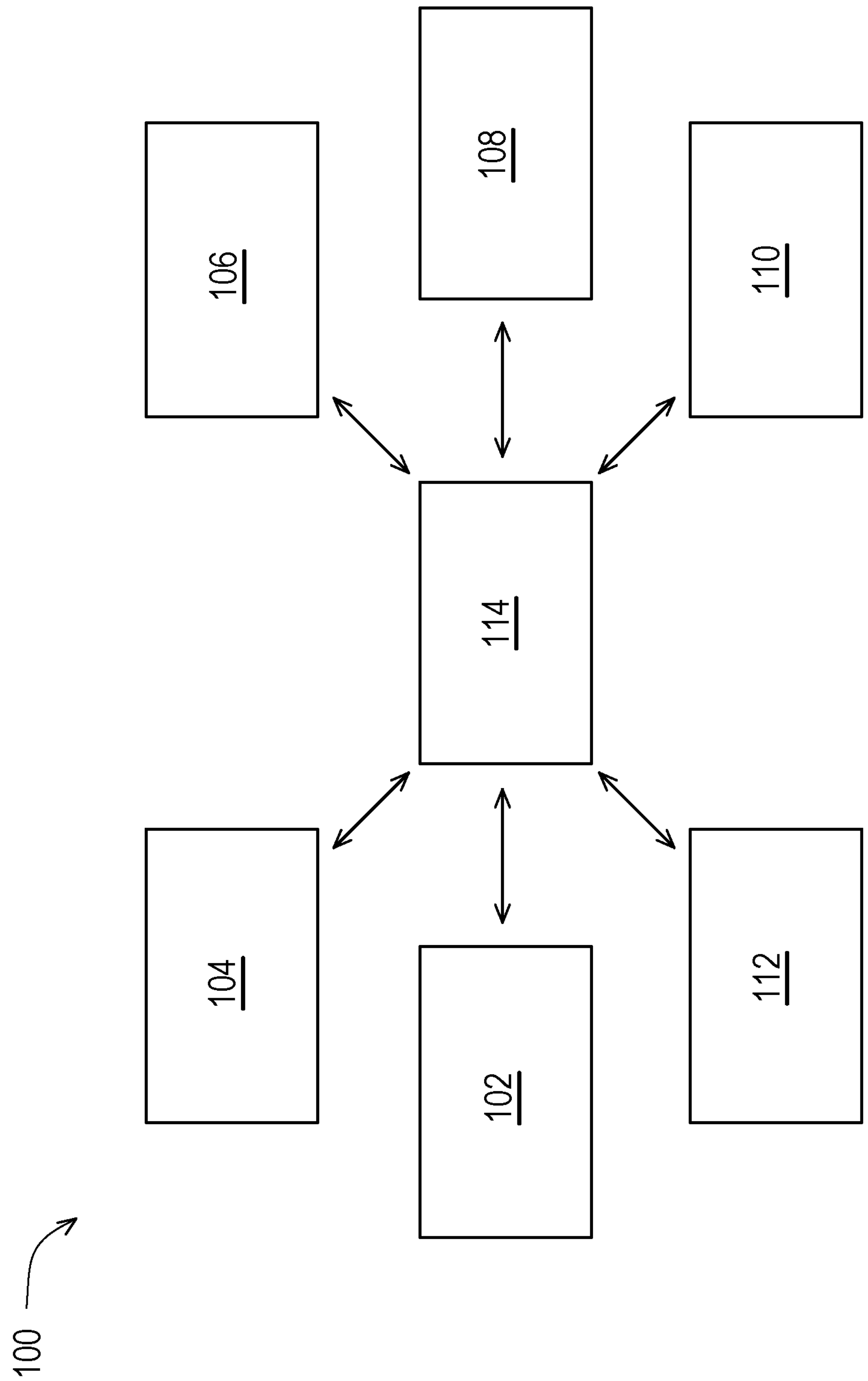
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, a ferroelectric random access memory (FeRAM) cell structure may a metal-oxide channel layer (e.g., a channel layer that includes a metal-oxide material or a metal-oxide-semiconductor material) above a ferroelectric layer, and a plurality of source/drain regions above the metal-oxide channel layer. The use of a metal-oxide channel layer may enable reduced current leakage to be achieved for the in the FeRAM cell structure relative to an elemental semiconductor channel or a III-V compound semiconductor channel. However, metal-oxide materials may be susceptible to electron migration from the source/drain regions, which may include one or more conductive metal materials. Electron migration may result in increased contact resistance between the metal-oxide channel layer and the source/drain regions.

In some cases, an electron barrier layer may be included between to the metal-oxide channel layer and the source/drain regions to minimize or prevent electron migration between the metal-oxide channel layer and the source/drain regions. However, the electron barrier layer may include one or more materials that are susceptible to dissociation and/or out-diffusion at high processing temperatures. When a metal glue layer is deposited on the electron barrier layer in preparation for forming a source/drain electrode of a source/drain region, the material of the metal glue layer may be deposited at a high deposition temperature such as approximately 350 degrees Celsius to approximately 800 degrees Celsius or greater. The high deposition temperature may result in dissociation and/or out-diffusion of the electron barrier layer, which may result in increased surface roughness in the metal glue layer and reduced adhesion between the metal glue layer and the source/drain electrode. This can cause the source/drain electrode to fail to adhere to the underlying metal-oxide channel layer and/or may result in voids or other types of discontinuities to form in the source/drain electrode, which can increase resistance in the FeRAM cell and/or render the FeRAM cell non-operational.

In some implementations described herein, an FeRAM cell may include an oxide insertion layer between the electron barrier layer and the metal glue layer of the source/drain regions of the FeRAM cell. The oxide insertion layer may improve the thermal stability of the electron barrier layer and minimize or prevent dissociation and/or out-diffusion of the electron barrier layer at high processing temperatures. Thus, the oxide insertion layer may enable the metal glue layer to be formed over the electron barrier layer with low surface roughness, which may enable increased adhesion between the metal glue layer and the source/drain electrodes of the source/drain regions. In this way, the oxide insertion layer may enable low electrical resistance to be achieved for the FeRAM cell and/or may reduce the likelihood of failures in the FeRAM cell, among other examples.

Moreover, in some implementations described herein, the source/drain electrodes of the source/drain regions may be formed using a quasi-atomic layer deposition (quasi-ALD) technique to reduce the total line resistance of the FeRAM cell, thereby increasing the operational efficiency of the FeRAM cell. The quasi-ALD technique includes the use of a chemical vapor deposition (CVD) tool in which a pulse-purge tungsten (PPW) process is performed in an ALD-like manner. A plurality of tungsten (W) precursor gas flow-in pulses are performed across a time duration of continuous hydrogen ($H_2$) reactant gas flow-in, where the tungsten precursor gas flow-in pulses are separated in time by a plurality of nitrogen ($N_2$) gas purges. The quasi-ALD technique described herein may enable particular crystalline phases to be increased in the source/drain electrodes, which may enable a larger grain size to be achieved for the source/drain electrodes than without the use of the quasi-ALD technique. The larger grain size enables the reduced total line resistance to be achieved for the FeRAM cell.

FIG. 1 is a diagram of an example environment 100 in which systems and/or methods described herein may be implemented. As shown in FIG. 1, the example environment 100 may include a plurality of semiconductor processing tools 102-112 and a wafer/die transport tool 114. The plurality of semiconductor processing tools 102-112 may include a deposition tool 102, an exposure tool 104, a developer tool 106, an etch tool 108, a planarization tool 110, a plating tool 112, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the deposition tool 102 includes an epitaxial tool that is configured to form layers and/or regions of a device by epitaxial growth. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

Wafer/die transport tool 114 includes a mobile robot, a robot arm, a tram or rail car, an overhead hoist transport (OHT) system, an automated materially handling system (AMHS), and/or another type of device that is configured to transport substrates and/or semiconductor devices between semiconductor processing tools 102-112, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, wafer/die transport tool 114 may be a programmed device that is configured to travel a particular path and/or may operate semi-autonomously or autonomously. In some implementations, the example environment 100 includes a plurality of wafer/die transport tools 114.

For example, the wafer/die transport tool 114 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 114 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations). In these implementations, the wafer/die transport tool 114 is configured to transport substrates and/or semiconductor devices between the processing chambers of the deposition tool 102 without breaking or removing a vacuum (or an at least partial vacuum) between the processing chambers and/or between processing operations in the deposition tool 102, as described herein.

In some implementations, one or more of the semiconductor processing tools 102-112 and/or the wafer/die transport tool 114 may perform one or more semiconductor processing operations described herein. For example, one or more of the semiconductor processing tools 102-112 and/or the wafer/die transport tool 114 may form a bottom gate electrode of a non-volatile memory cell structure; may form a ferroelectric layer of the non-volatile memory cell structure above the bottom gate electrode; may form a metal-oxide channel layer of the non-volatile memory cell structure above the ferroelectric layer; may form a dielectric layer above the metal-oxide channel layer; may form a recess in the dielectric layer to expose the metal-oxide channel layer through the recess; may form an electron barrier layer on the metal-oxide channel layer in the recess; may form an oxide insertion layer on the electron barrier layer in the recess; may form a metal glue layer on the oxide insertion layer in the recess; and/or may form a source/drain electrode of the non-volatile memory cell structure on the metal glue layer, among other examples. In some implementations, one or more of the semiconductor processing tools 102-112 and/or the wafer/die transport tool 114 may perform one or more of the semiconductor process operations described in connection with FIGS. 4A-4O, 9A-9G, and/or 12, among other examples.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of the example environment 100 may perform one or more functions described as being performed by another set of devices of the example environment 100.

Figure 2:
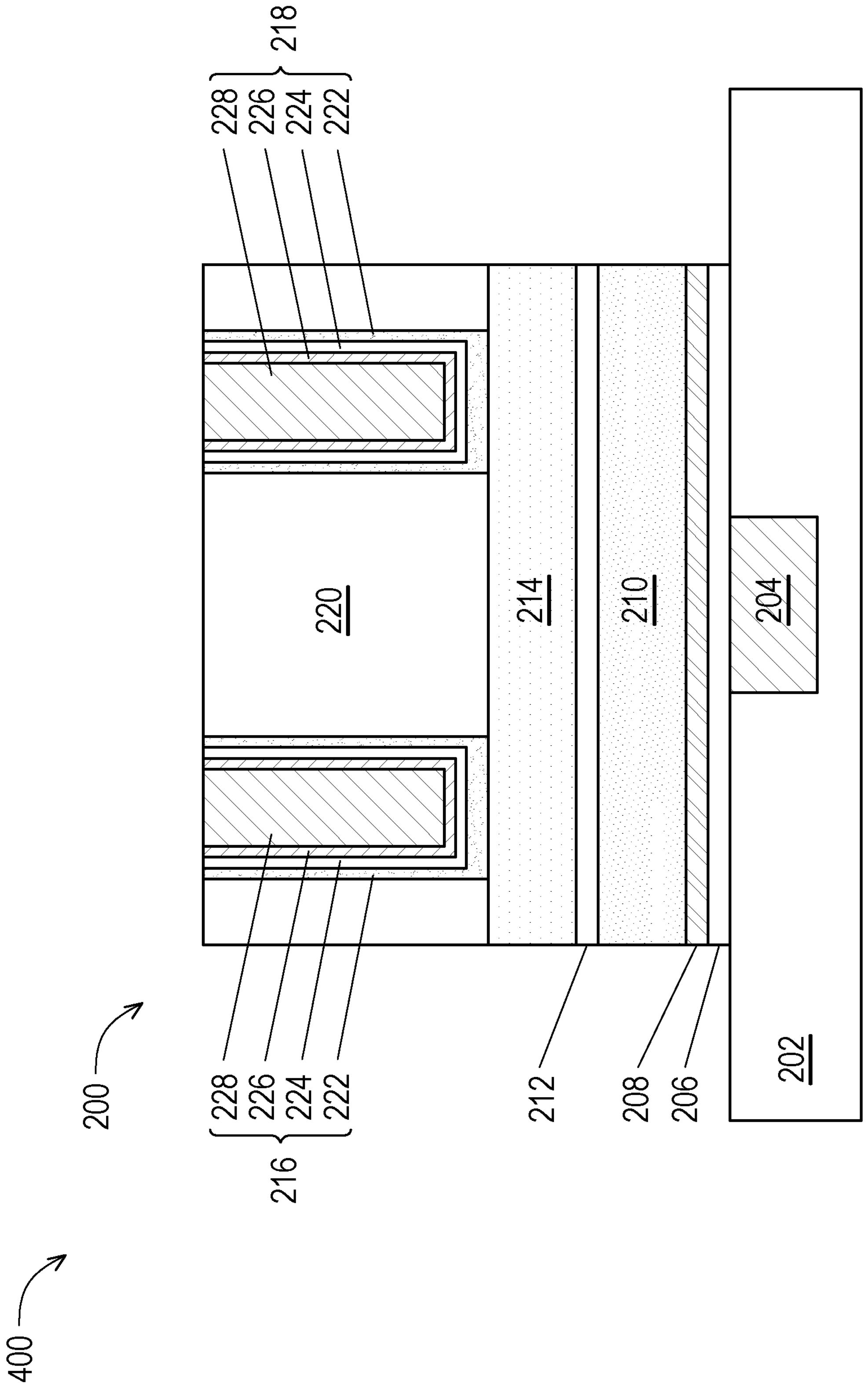
FIG. 2 is a diagram of an example non-volatile memory cell structure described herein.

FIG. 2 is a diagram of an example non-volatile memory cell structure 200 described herein. The non-volatile memory cell structure 200 may include a ferroelectric non-volatile memory cell structure such as an FeRAM cell. As described herein, the non-volatile memory cell structure 200 may include an oxide insertion layer that enables a metal glue layer to be formed over an electron barrier layer of the non-volatile memory cell structure 200 with low surface roughness, which may enable increased adhesion between the metal glue layer and source/drain electrodes of the source/drain regions of the non-volatile memory cell structure 200. In this way, the oxide insertion layer included in the non-volatile memory cell structure 200 may enable low electrical resistance to be achieved for the non-volatile memory cell structure 200 and/or may reduce the likelihood of failures in the non-volatile memory cell structure 200, among other examples.

As shown in FIG. 2, the non-volatile memory cell structure 200 may include an isolation layer 202 and a bottom gate electrode 204 included in the isolation layer 202. The bottom gate electrode 204 may also be referred to as a buried electrode and may be the gate of the non-volatile memory cell structure 200. The bottom gate electrode 204 may be electrically coupled with a word line of a non-volatile memory array in which the non-volatile memory cell structure 200 is included. The isolation layer 202 may include one or more dielectric materials, such as an oxide, a nitride, a silicon oxide ($SiO_x$), a silicon nitride ($Si_xN_y$), a silicon oxynitride (SiON), fluoride-doped silicate glass (FSG), a low-k dielectric material, and/or another suitable electrically insulating material. The bottom gate electrode 204 may include one or more electrically conductive metal materials having a relatively low coefficient of thermal expansion (CTE). Examples of such electrically conductive metal-containing materials include platinum (Pt), titanium (Ti), titanium nitride (TiN), tantalum (Ta), tantalum nitride (TaN), tungsten (W), iron (Fc), nickel (Ni), cobalt (Co), chromium (Cr), beryllium (Be), antimony (Sb), iridium (Ir), molybdenum (Mo), osmium (Os), thorium (Th), vanadium (V), and/or an alloy thereof, among other examples.

The non-volatile memory cell structure 200 may include a stress relief layer 206 over and/or on the bottom gate electrode 204. The stress relief layer 206 may include an oxide-containing material that is configured to reduce stress inducement in the non-volatile memory cell structure 200 from thermal expansion and/or contraction, and/or from other types of stress experienced by the non-volatile memory cell structure 200. Examples of oxide-containing materials for the stress relief layer 206 include tantalum pentoxide ($Ta_2O_5$), potassium oxide ($K_2O$), rubidium oxide ($Rb_2O$), strontium oxide (SrO), barium oxide (BaO), amorphous vanadium oxide ($\alpha$-$V_2O_3$), amorphous chromium oxide ($\alpha$-$Cr_2O_3$), amorphous gallium oxide ($\alpha$-$Ga_2O_3$), amorphous iron oxide ($\alpha$-$Fe_2O_3$), amorphous titanium oxide ($\alpha$-$Ti_2O_3$), amorphous indium oxide ($\alpha$-$In_2O_3$), yttrium aluminum perovskite ($YAlO_3$ or YAP), bismuth oxide ($Bi_2O_3$), ytterbium oxide ($Yb_2O_3$), dysprosium oxide ($Dy_2O_3$), gadolinium oxide ($Gd_2O_3$), strontium titanium oxide ($SrTiO_3$) dysprosium scandium oxide ($DyScO_3$), terbium scandium oxide ($TbScO_3$), gadolinium scandium oxide ($GdScO_3$), neodymium scandium oxide ($NdScO_3$), neodymium gallium oxide ($NdGaO_3$), and/or tantalum lanthanum strontium aluminate ($LaSrAlTaO_3$ or LSAT), among other examples. In some implementations, the stress relief layer 206 includes a bi-layer epitaxial structure that includes lanthanum strontium manganese oxide ($LaSrMnO_3$ or LSMO) and $SrTiO_3$, LSMO and $DyScO_3$, LSMO and $TbScO_3$, LSMO and $GdScO_3$, LSMO and $NdScO_3$, LSMO and $NdGaO_3$, and/or LSMO and LSAT, among other examples. In some implementations, a thickness of the stress relief layer 206 is included in a range of approximately 0.5 nanometers to approximately 5 nanometers. However, other values for the range are within the scope of the present disclosure.

The non-volatile memory cell structure 200 may include a seed layer 208 over and/or on the stress relief layer 206. The seed layer 208 may provide a substrate on which a ferroelectric layer 210 of the non-volatile memory cell structure 200 is formed. The seed layer 208 may include a single layer structure or a multiple layer structure. The seed layer 208 may primarily have a cubic phase, a tetragonal phase, and/or an orthorhombic phase (e.g., where the cubic phase, the tetragonal phase, and/or the orthorhombic phase are greater than the monoclinic phase). The seed layer 208 may include one or more oxide materials, such as zirconium oxide (ZrO or $ZrO_2$), yttrium oxide ($Y_2O_3$), hafnium oxide ($HfO_2$), aluminum oxide ($Al_2O_3$), hafnium zirconium oxide ($Hf_xZr_{1-x}O_y$), and/or another oxide material. In some implementations, a thickness of the seed layer 208 is included in a range of approximately 0.1 nanometers to approximately 5 nanometers. However, other values for the range are within the scope of the present disclosure.

The ferroelectric layer 210 may be included over and/or on the seed layer 208. The ferroelectric layer 210 may include a ferroelectric material having oxygen vacancies and/or primarily including a cubic phase, a tetragonal phase, and/or an orthorhombic phase (e.g., where the cubic phase, the tetragonal phase, and/or the orthorhombic phase are greater than the monoclinic phase). Examples include hafnium oxide (e.g., HfO or $HfO_2$), a zirconium oxide (e.g., $ZrO_2$), HfZrO or HZO (e.g., $Hf_xZr_{1-x}O_y$, where x is from 0 to 1, such as $Hf_{0.5}Zr_{0.5}O_2$), a hafnium silicon oxide (e.g., HfSiO), a hafnium lanthanum oxide (e.g., HfLaO), aluminum nitride (AlN), aluminum scandium nitride (e.g., AlScN), PBT (e.g., $PbZrO_3$), PZT (e.g., Pb $[Zr_xTi_{1-x}]O_3$, ($0 \le x \le 1$)), PLZT (e.g., $Pb_{1-x}La_xZr_{1-y}Ti_yO_3$), barium titanate (e.g., $BaTiO_3$), lead titanate (e.g., $PbTiO_3$), lead metaniobate (e.g., $PbNb_2O_6$), lithium niobate (e.g., $LiNbO_3$), lithium tantalate (e.g., $LiTaO_3$), PMN (e.g., $PbMg_{1-3}Nb_{2/3}O_3$), PST (e.g., $PbSc_{1/2}Ta_{1/2}O_3$), SBT (e.g., $SrBi_zTa_2O_9$), BNT (e.g., $Bi_{1/2}Na_{1/2}TiO_3$), and/or combinations thereof, among other examples. In some implementations, the ferroelectric material may include dopants such as scandium (Sc), lanthanum (La), calcium (Ca), barium (Ba), yttrium (Y), strontium (Sr), and/or gadolinium (Gd), among other examples. In some implementations, a thickness of the ferroelectric layer 210 is included in a range of approximately 0.1 nanometers to approximately 100 nanometers. However, other values for the range are within the scope of the present disclosure.

The non-volatile memory cell structure 200 may include a blocking layer 212 over and/or on the ferroelectric layer 210. The blocking layer 212 may include a combination of silicon (Si) and hafnium oxide ($HfO_2$). The blocking layer 212 may have a silicon to hafnium oxide ratio of greater than approximately 1:10. However, other values are within the scope of the present disclosure. Additionally and/or alternatively, the blocking layer 212 may include one or more of silicon (Si), magnesium (Mg), aluminum (Al), lanthanum (La), yttrium oxide ($Y_2O_3$), nitrogen (N), calcium (Ca), scandium (Sc), strontium (Sr), and/or gadolinium (Gd), among other examples. In some implementations, an oxygen to zirconium concentration or an oxygen to hafnium concentration at the interface between the blocking layer 212 and the ferroelectric layer 210 may be greater than or equal to approximately 1:1. However, other values are within the scope of the present disclosure. In some implementations, a thickness of the blocking layer 212 is included in a range of approximately 0.1 nanometers to approximately 10 nanometers. However, other values for the range are within the scope of the present disclosure.

The non-volatile memory cell structure 200 may include a metal-oxide channel layer 214 over and/or on the blocking layer 212. The metal-oxide channel layer 214 may include one or more metal-oxide materials or metal-oxide-semiconductor materials. Examples include indium gallium zinc oxide (InGaZnO or IGZO), amorphous IGZO (α-IGZO), and/or tin gallium zinc oxide (SnGaZnO or SGZO), among other examples. In some implementations, hafnium (Hf), zirconium (Zr), titanium (Ti), aluminum (Al), tantalum (Ta), strontium (Sr), barium (Ba), scandium (Sc), magnesium (Mg), lanthanum (La), and/or gadolinium (Gd) may be used instead of gallium in the metal-oxide channel layer 214 to achieve a lower concentration of oxygen vacancies and/or to achieve lower surface states.

The non-volatile memory cell structure 200 may include source/drain regions 216 and 218 above and/or on the metal-oxide channel layer 214. The bottom gate electrode 204, the ferroelectric layer 210, the metal-oxide channel layer 214, and the source/drain regions 216 and 216 may correspond to a ferroelectric field effect transistor (FeFET) of the non-volatile memory cell structure 200. A source/drain region may refer to a source or a drain, individually or collectively dependent upon the context. The source/drain regions 216 may be included in a dielectric layer 220 above the metal-oxide channel layer 214. The dielectric layer 220 may include one or more dielectric materials, such as an oxide, a nitride, a silicon oxide ($SiO_x$), a silicon nitride ($Si_xN_y$), a silicon oxynitride (SiON), fluoride-doped silicate glass (FSG), a low-k dielectric material, and/or another suitable electrically insulating material. In some implementations, a height or a thickness of the source/drain regions 216 and/or 218 may be included in a range of approximately 10 nanometers to approximately 600 nanometers. However, other values for the range are within the scope of the present disclosure.

To transition the non-volatile memory cell structure 200 to a programmed state, a first gate voltage (e.g., a positive gate voltage $+V_G$) may be applied to the bottom gate electrode 204. This causes electron charge carriers in electron/hole pairs in the ferroelectric layer 210 to be biased toward the bottom gate electrode 204. A 0 voltage (0V) may be applied to the source/drain region 216, and the source/drain region 218 may be grounded. This causes the metal-oxide channel layer 214 to be in a non-conductive state, thereby causing hole charge carriers in the electron/hole pairs of the ferroelectric layer 210 to be biased toward the metal-oxide channel layer 214.

To transition the non-volatile memory cell structure 200 to an erased state, a second gate voltage (e.g., a negative gate voltage $-V_G$) may be applied to the bottom gate electrode

204. A 0 voltage (0V) may be applied to the source/drain region 216, and the source/drain region 218 may be grounded. This causes the metal-oxide channel layer 214 to be in a conductive state. This causes the hole charge carriers in electron/hole pairs in the ferroelectric layer 210 to be biased toward the bottom gate electrode 204, and causes the electron charge carriers in the electron/hole pairs of the ferroelectric layer 210 to be biased toward the metal-oxide channel layer 214.

The source/drain regions 216 and 218 may each include an electron barrier layer 222, an oxide insertion layer 224 over and/or on the electron barrier layer 222, a metal glue layer 226 over and/or on the oxide insertion layer 224, and a source/drain electrode 228 over and/or on the metal glue layer 226. The electron barrier layer 222 may be included directly on the metal-oxide channel layer 214 and between the metal-oxide channel layer 214 and the oxide insertion layer 224, the metal glue layer 226, and the source/drain electrode 228. The electron barrier layer 222 may also extend along sidewalls of the source/drain electrode 228 such that the electron barrier layer 222 is included directly on the dielectric layer 220 and between the dielectric layer 220 and the oxide insertion layer 224, the metal glue layer 226, and the source/drain electrode 228.

The electron barrier layer 222 may be included to minimize or prevent electron migration between the metal-oxide channel layer 214 and the source/drain electrodes 228 of the source/drain regions 216 and/or 218. The electron barrier layer 222 may enable the Schottky barrier height between the source/drain electrode 228 and the metal-oxide channel layer 214 to be tuned to improve the electrical performance of the non-volatile memory cell structure 200. Additionally and/or alternatively, the electron barrier layer 222 may provide resistance to penetration of carbon, hydrogen, and/or nitrogen downward into the metal-oxide channel layer 214. In some implementations, a thickness of the electron barrier layer 222 may be included in a range of approximately 1 nanometer to approximately 20 nanometers. If the thickness of the electron barrier layer 222 is less than approximately 1 nanometer, voids and/or other discontinuities may occur in the electron barrier layer 222, resulting in reduced electron barrier performance for the electron barrier layer 222. Selecting a thickness of greater than approximately 20 nanometers for the electron barrier layer 222 may result in increased electrical resistance for the source/drain regions 216 and/or 218, which may lead to reduced switching speeds for the non-volatile memory cell structure 200. Selecting a thickness for the electron barrier layer 222 in the range of approximately 1 nanometer to approximately 20 nanometers enables the electron barrier layer 222 to provide sufficient electronic migration blocking while enabling a sufficiently low electrical resistance to be achieved for the source/drain regions 216 and/or 218. However, other values for the thickness of the electron barrier layer 222, and ranges other than approximately 1 nanometer to approximately 20 nanometers, are within the scope of the present disclosure.

In some implementations, the electron barrier layer 222 may include a binary conductive metal-oxide, such as indium oxide (InO), zinc oxide (ZnO), and/or tin oxide (SnO), among other examples. In some implementations, the electron barrier layer 222 may include a ternary conductive metal-oxide, such as indium zinc oxide (InZnO or IZO), aluminum zinc oxide (AlZnO or AZO), and/or indium tin oxide (InSnO or ITO), among other examples. In some implementations, the electron barrier layer 222 may include another type of conductive metal-oxide, such as tin IGZO (SnIGZO) and/or magnesium IGZO (MgIGZO), among other examples.

The oxide insertion layer 224 may be included over the metal-oxide channel layer 214 and between the electron barrier layer 222 and the metal glue layer 226 and the source/drain electrode 228. The oxide insertion layer 224 may also extend along the sidewalls of the source/drain electrode 228 such that the oxide insertion layer 224 is included between the dielectric layer 220 and the sidewalls of the source/drain electrode 228.

The oxide insertion layer 224 may be included to reduce, minimize, and/or prevent intermixing between the electron barrier layer 222 and the metal glue layer 226. The oxide insertion layer 224 may reduce, minimize, and/or prevent intermixing between the electron barrier layer 222 and the metal glue layer 226 in that the oxide insertion layer 224 may protect the electron barrier layer 222 from and/or during high-temperature semiconductor processing operations associated with the non-volatile memory cell structure 200. The oxide insertion layer 224 may reduce, minimize, and/or prevent out-diffusion and/or dissociation of the electron barrier layer 222, that might otherwise occur due to the high-temperature semiconductor processing operations associated with the non-volatile memory cell structure 200, and that might otherwise result in intermixing of the electron barrier layer 222 and the metal glue layer 226. Intermixing of the electron barrier layer 222 and the metal glue layer 226 might otherwise result in high surface roughness in the metal glue layer 226, which can result in low bonding energy between the metal glue layer 226 and the source/drain electrode 228. The low bonding energy might otherwise result in delamination between the metal glue layer 226 and the source/drain electrode 228, and failure of the non-volatile memory cell structure 200. The oxide insertion layer 224 may enable a low surface roughness to be achieved for the metal glue layer 226 (e.g., because of the minimization or prevention of intermixing of the electron barrier layer 222 and the metal glue layer 226), which may increase adhesion between the metal glue layer 226 and the source/drain electrode 228. Accordingly, the oxide insertion layer 224 may reduce, minimize, and/or prevent delamination between the metal glue layer 226 and the source/drain electrode 228 and/or failure of the non-volatile memory cell structure 200.

In some implementations, a thickness of the oxide insertion layer 224 may be included in a range of approximately 0.5 angstroms (e.g., one monolayer) to approximately 5 nanometers. If the thickness of the oxide insertion layer 224 is less than approximately 0.5 angstroms, voids and/or other discontinuities may occur in the oxide insertion layer 224, resulting in intermixing between the electron barrier layer 222 and the metal glue layer 226. Selecting a thickness of greater than approximately 5 nanometers for the oxide insertion layer 224 may result in increased electrical resistance for the source/drain regions 216 and/or 218 (e.g., because of less available space for the source/drain electrode 228), which may lead to reduced switching speeds for the non-volatile memory cell structure 200, and/or may result in reduced gap-filling performance for the source/drain electrode 228. Selecting a thickness for the oxide insertion layer 224 in the range of approximately 0.5 angstroms to approximately 5 nanometers enables the oxide insertion layer 224 to provide sufficient intermixing blocking while enabling a sufficiently low electrical resistance to be achieved for the source/drain regions 216 and/or 218. However, other values for the thickness of the oxide insertion layer 224, and ranges other than approximately 0.5 angstroms to approximately 5 nanometers, are within the scope of the present disclosure.

In some implementations, the oxide insertion layer 224 may include an oxide-semiconductor material, such as gallium oxide (GaO) and/or silicon oxide ($SiO_x$ such as $SiO_2$), among other examples. In some implementations, the oxide insertion layer may include a metal-oxide material, such as zirconium oxide ($ZrO_x$ such as $ZrO_2$), hafnium oxide ($HfO_x$ such as $HfO_2$), and/or aluminum oxide ($Al_xO_y$ such as $Al_2O_3$), among other examples. In some implementations, the oxide insertion layer 224 may include a high dielectric constant (high-k) dielectric material, such as a dielectric material having a dielectric constant greater than silicon oxide. In some implementations, the oxide insertion layer 224 includes a plurality of materials, such as a plurality of oxide-semiconductor materials, a plurality of metal-oxide materials, a plurality of high-k dielectric materials, and/or a combination thereof.

The metal glue layer 226 may be included over the metal-oxide channel layer 214 and between the oxide insertion layer 224 and the source/drain electrode 228. The metal glue layer 226 may also extend along sidewalls of the source/drain electrode 228 such that the metal glue layer 226 is included between the dielectric layer 220 and the source/drain electrode 228. The metal glue layer 226 may be include to promote adhesion of the source/drain electrode 228 to the dielectric layer 220 and/or to promote adhesion of the source/drain electrode 228 to the metal-oxide channel layer 214. The metal glue layer 226 may include one or more metal materials, such as aluminum (Al), titanium (Ti), tantalum (Ta), tungsten (W), ruthenium (Ru), cobalt (Co), copper (Cu), and/or gold (Au), among other examples.

The source/drain electrode 228 may be electrically coupled with one or more metallization layers to electrically couple the source/drain electrode 228 to an electrical source or to an electrical ground, among other examples. The source/drain electrode 228 may include one or more metal materials, such as aluminum (Al), titanium (Ti), tantalum (Ta), tungsten (W), ruthenium (Ru), cobalt (Co), copper (Cu), and/or gold (Au), among other examples.

As indicated above, FIG. 2 is provided as an example. Other examples may differ from what is described with regard to FIG. 2.

Figure 3B:
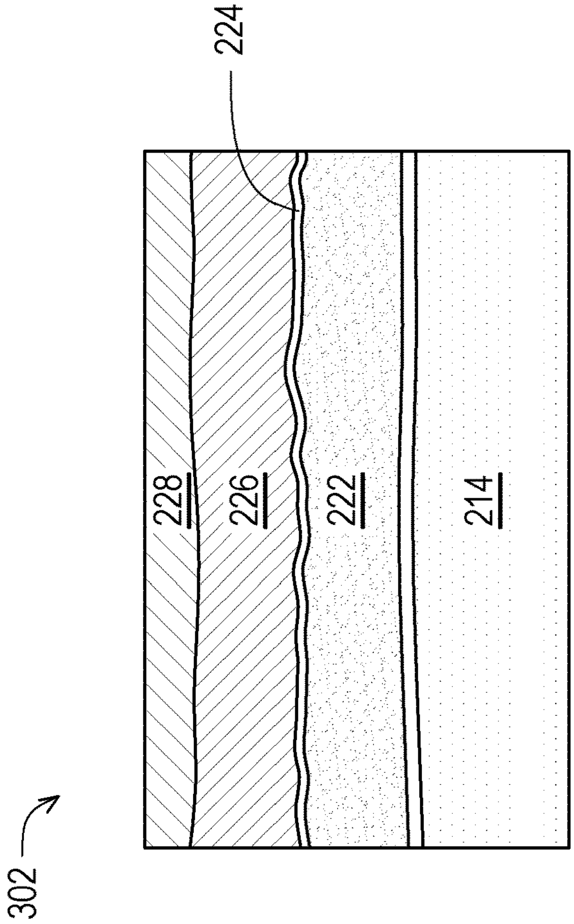
FIGS. 3A and 3B are diagrams of examples of surface roughness of metal glue layers described herein.
Figure 3A:
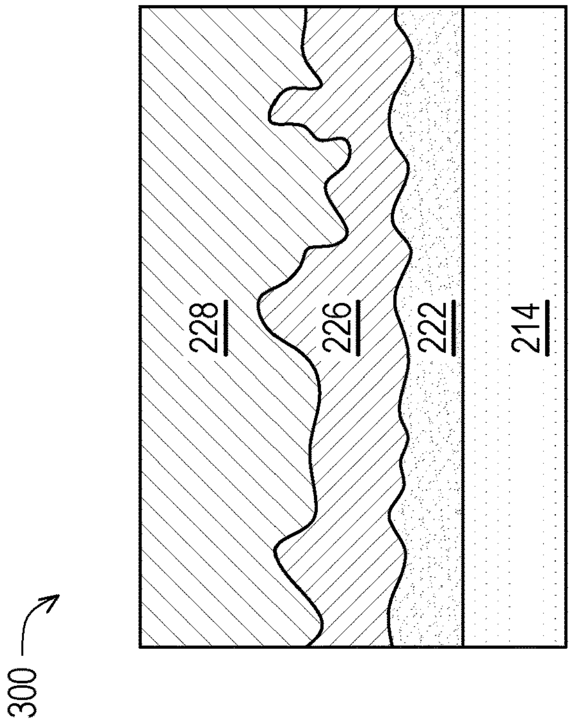

FIGS. 3A and 3B are diagrams of examples of surface roughness of metal glue layers described herein. Example 300 in FIG. 3A is an example of a non-volatile memory cell structure that does not include an oxide insertion layer 224, and example 302 in FIG. 3B is an example of the non-volatile memory cell structure 200 (which includes the oxide insertion layer 224).

As shown in FIGS. 3A and 3B, the omission of the oxide insertion layer 224 in the example 300 results in intermixing between the electron barrier layer 222 and the metal glue layer 226, whereas the inclusion of the oxide insertion layer 224 in the example 302 may prevent intermixing between the electron barrier layer 222 and the metal glue layer 226. The intermixing in the example 300 results in a high surface roughness for the metal glue layer 226, which may result in reduced adhesion and/or increased likelihood of delamination between the metal glue layer 226 and the source/drain electrode 228. In contract, the lack of intermixing in the example 302 results in low surface roughness relative to the example 300, which may increase adhesion and/or reduce the likelihood of delamination between the metal glue layer 226 and the source/drain electrode 228.

As indicated above, FIGS. 3A and 3B are provided as examples. Other examples may differ from what is described with regard to FIGS. 3A and 3B.

Figure 4A:
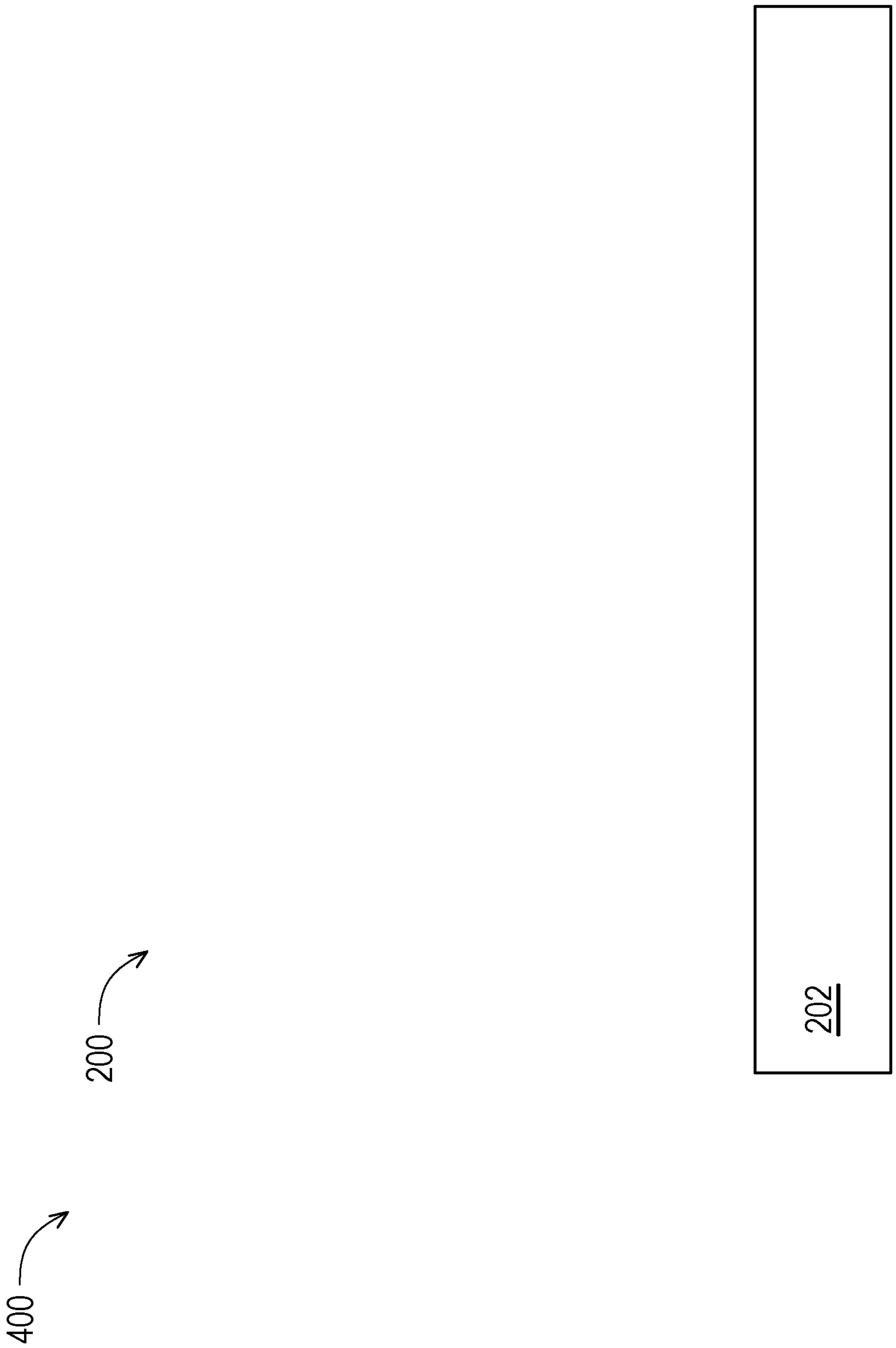
FIGS. 4A-4O are diagrams of an example implementation of forming a non-volatile memory cell structure described herein.

FIGS. 4A-4O are diagrams of an example implementation 400 of forming the non-volatile memory cell structure 200 described herein. In some implementations, one or more of the semiconductor processing operations described in connection with FIGS. 4A-4O may be performed using one or more of the semiconductor processing tools 102-112 described herein. In some implementations, one or more of the semiconductor processing operations described in connection with FIGS. 4A-4O may be performed using another type of semiconductor processing tool.

As shown in FIG. 4A, the operations described in the example implementation 400 may be performed in connection with the isolation layer 202. The isolation layer 202 may be formed over and/or on a substrate (e.g., a semiconductor substrate such as a silicon (Si) wafer) or over and/or on another layer of a semiconductor device. A deposition tool 102 may be used to deposit the isolation layer 202 using a PVD technique, an ALD technique, a CVD technique, an oxidation technique, another type of deposition technique described in connection with FIG. 1, and/or another suitable deposition technique. In some implementations, a planarization tool 110 may be used to planarize the isolation layer 202 after the isolation layer 202 is deposited.

Figure 4B:
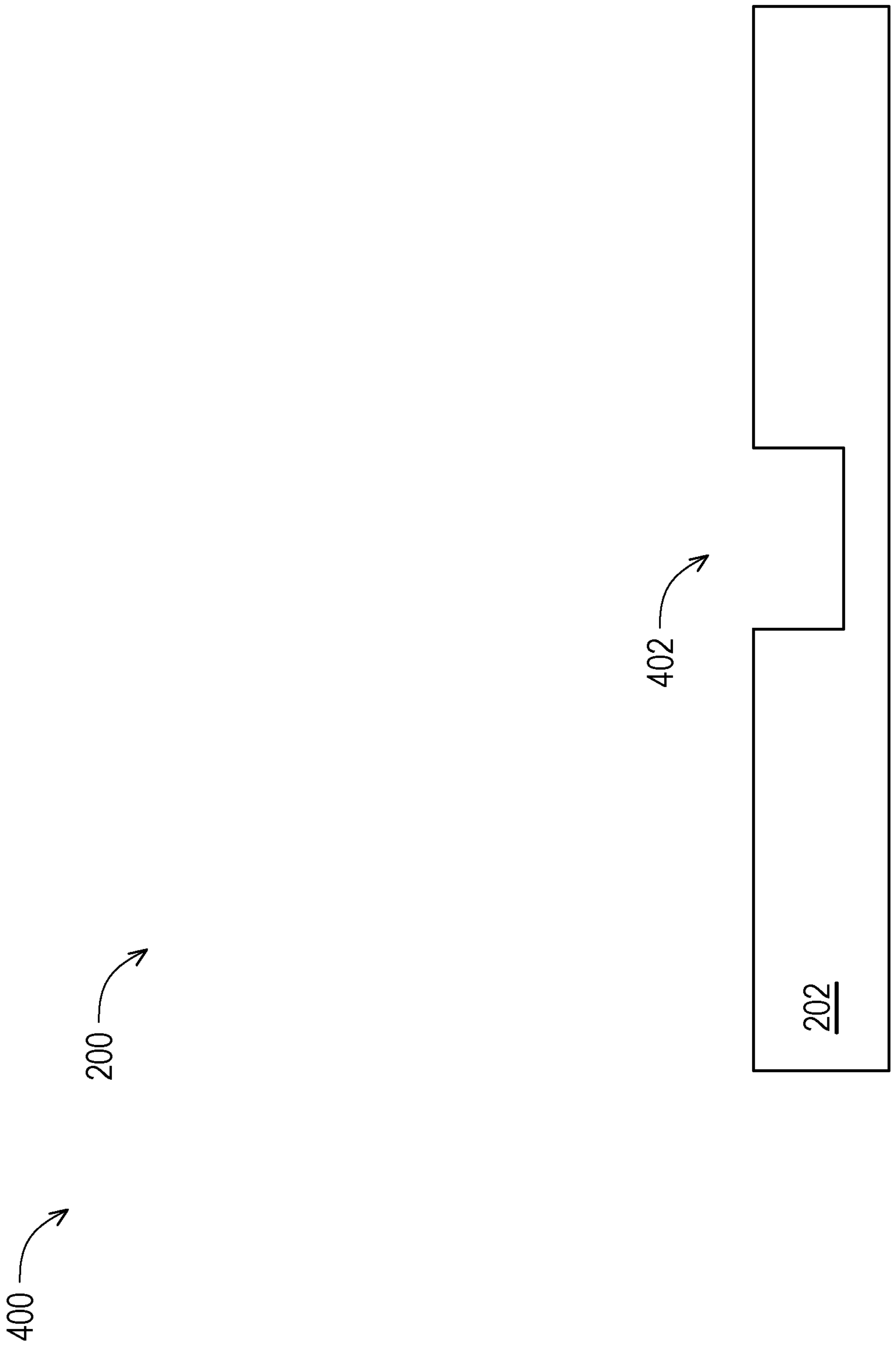
Figure 4C:
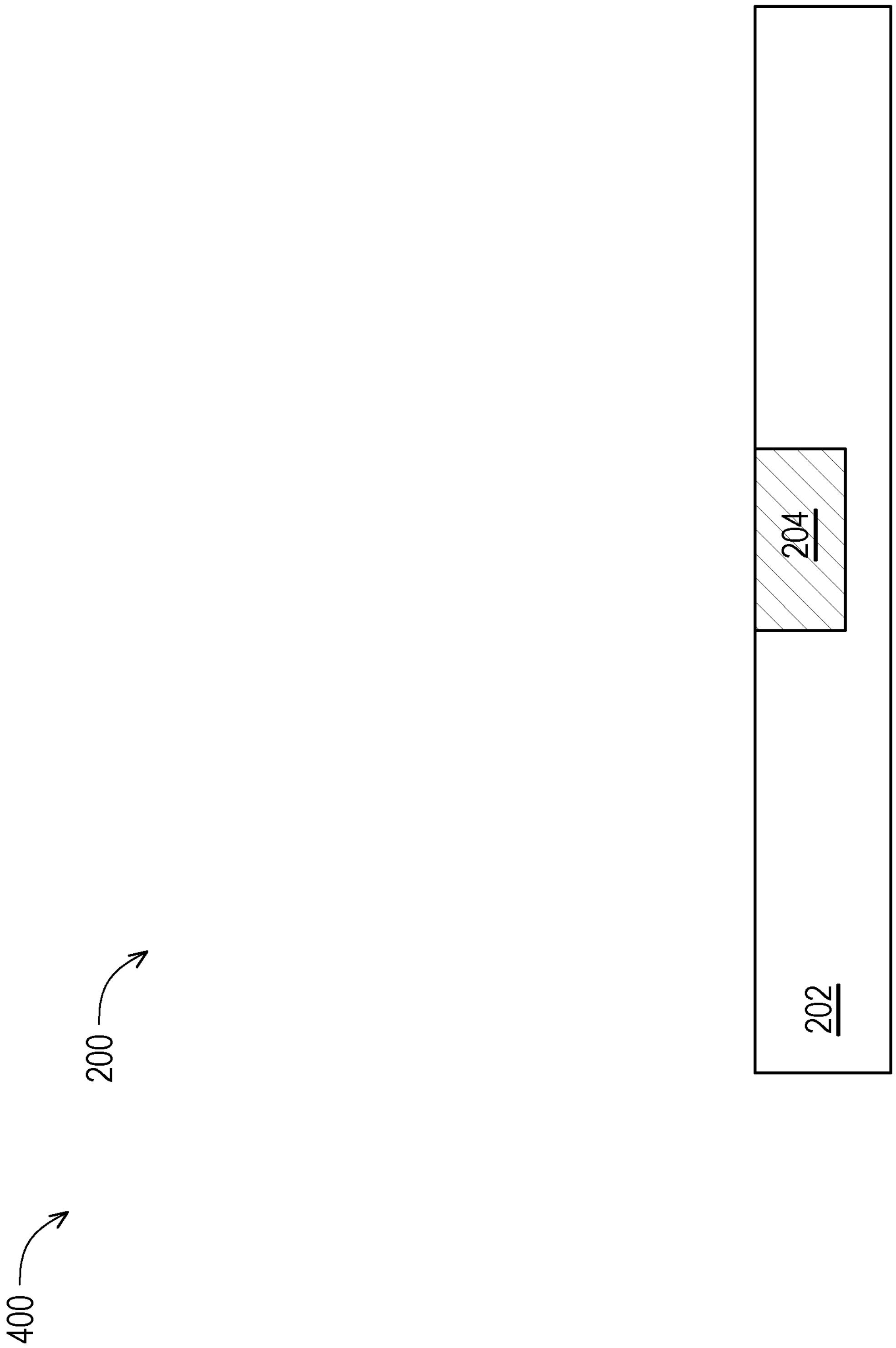

As shown in FIGS. 4B and 4C, the bottom gate electrode 204 may be formed in the isolation layer 202. The bottom gate electrode 204 may be formed in a recess 402 in the isolation layer 202. Alternatively, the bottom gate electrode 204 may be formed on the isolation layer 202.

In some implementations, a pattern in a photoresist layer is used to etch the isolation layer 202 to form a recess 402. In these implementations, a deposition tool 102 may be used to form the photoresist layer on the isolation layer 202. An exposure tool 104 may be used to expose the photoresist layer to a radiation source to pattern the photoresist layer. A developer tool 106 may be used to develop and remove portions of the photoresist layer to expose the pattern. An etch tool 108 may be used to etch the isolation layer 202 based on the pattern to form the recess 402 in the isolation layer 202. In some implementations, the etch operation includes a plasma etch operation, a wet chemical etch operation, and/or another type of etch operation. In some implementations, a photoresist removal tool may be used to remove the remaining portions of the photoresist layer (e.g., using a chemical stripper, plasma ashing, and/or another technique). In some implementations, a hard mask layer is used as an alternative technique for etching the isolation layer 202 based on a pattern.

A deposition tool 102 and/or a plating tool 112 may deposit the bottom gate electrode 204 in the recess 402 using a CVD technique, a PVD technique, an ALD technique, an electroplating technique, another deposition technique described above in connection with FIG. 1, and/or a deposition technique other than as described above in connection with FIG. 1. In some implementations, a planarization tool 110 may perform a CMP operation to planarize the bottom gate electrode 204 after the bottom gate electrode 204 is deposited.

Figure 4D:
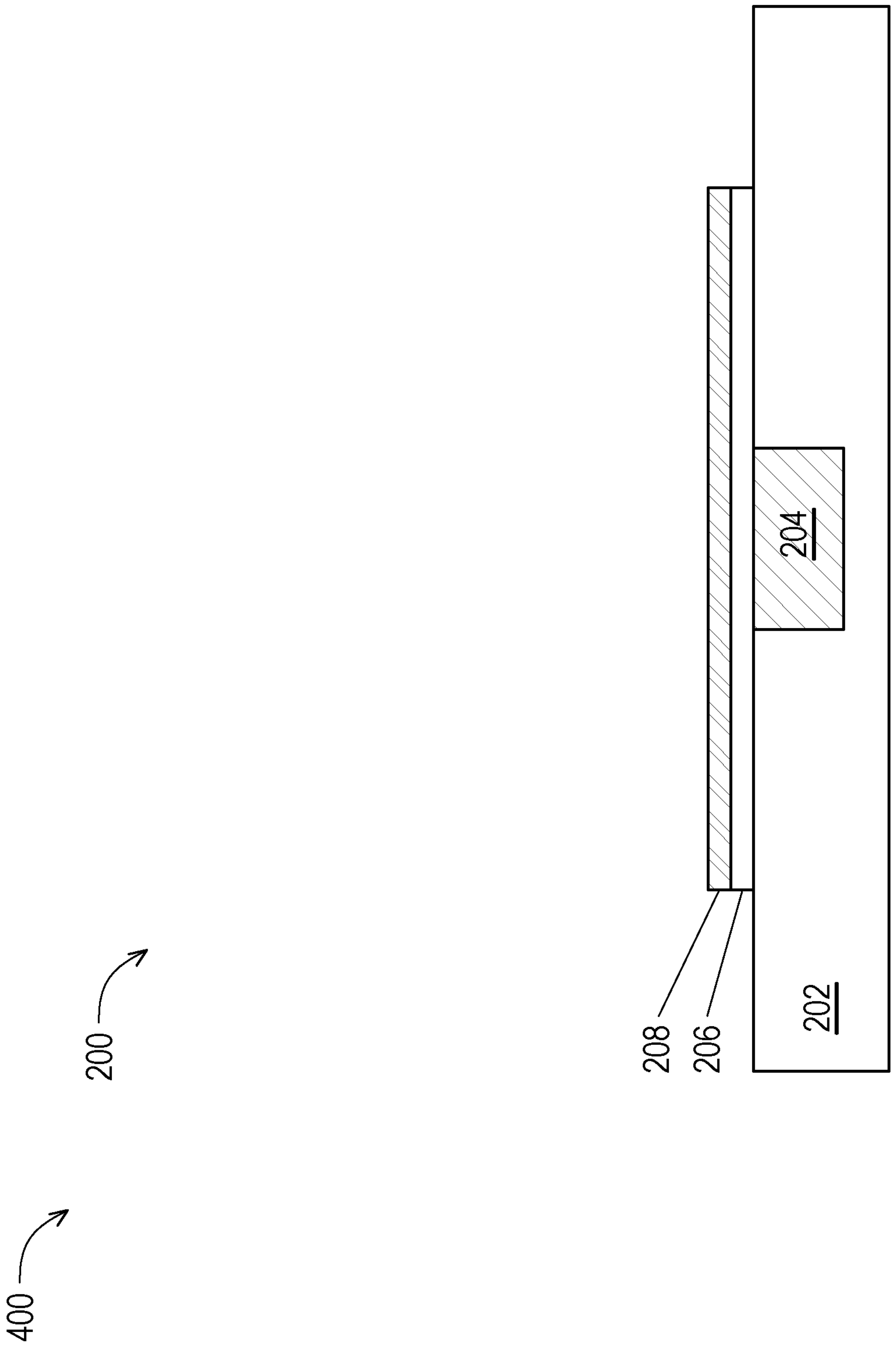

As shown in FIG. 4D, the stress relief layer 206 may be formed over and/or on the isolation layer 202 and over and/or on the bottom gate electrode 204. The seed layer 208 may be formed over and/or on the stress relief layer 206. In some implementations, a deposition tool 102 may be used to perform an in-situ thermal annealing operation, which may include thermally annealing the stress relief layer 206 and/or the seed layer 208 while the deposition tool 102 is used to deposit the stress relief layer 206 and/or the seed layer 208. The thermal annealing operation may increase the crystallinity of the stress relief layer 206 and/or the seed layer 208. The deposition tool 102 may be used to deposit the stress relief layer 206 and/or the seed layer 208 using an ALD technique or a pulse layer deposition (PLD) technique. The deposition tool 102 may heat the stress relief layer 206 and/or the seed layer 208 to a temperature that is included in a range of approximately 300 degrees Celsius to approximately 700 degrees Celsius for approximately 30 seconds to approximately 10 minutes to achieve crystallinity of the stress relief layer 206 and/or the seed layer 208. However, other values for these ranges are within the scope of the present disclosure. Moreover, the stress relief layer 206 may be formed as a quasi-single crystal metal oxide.

Figure 4E:
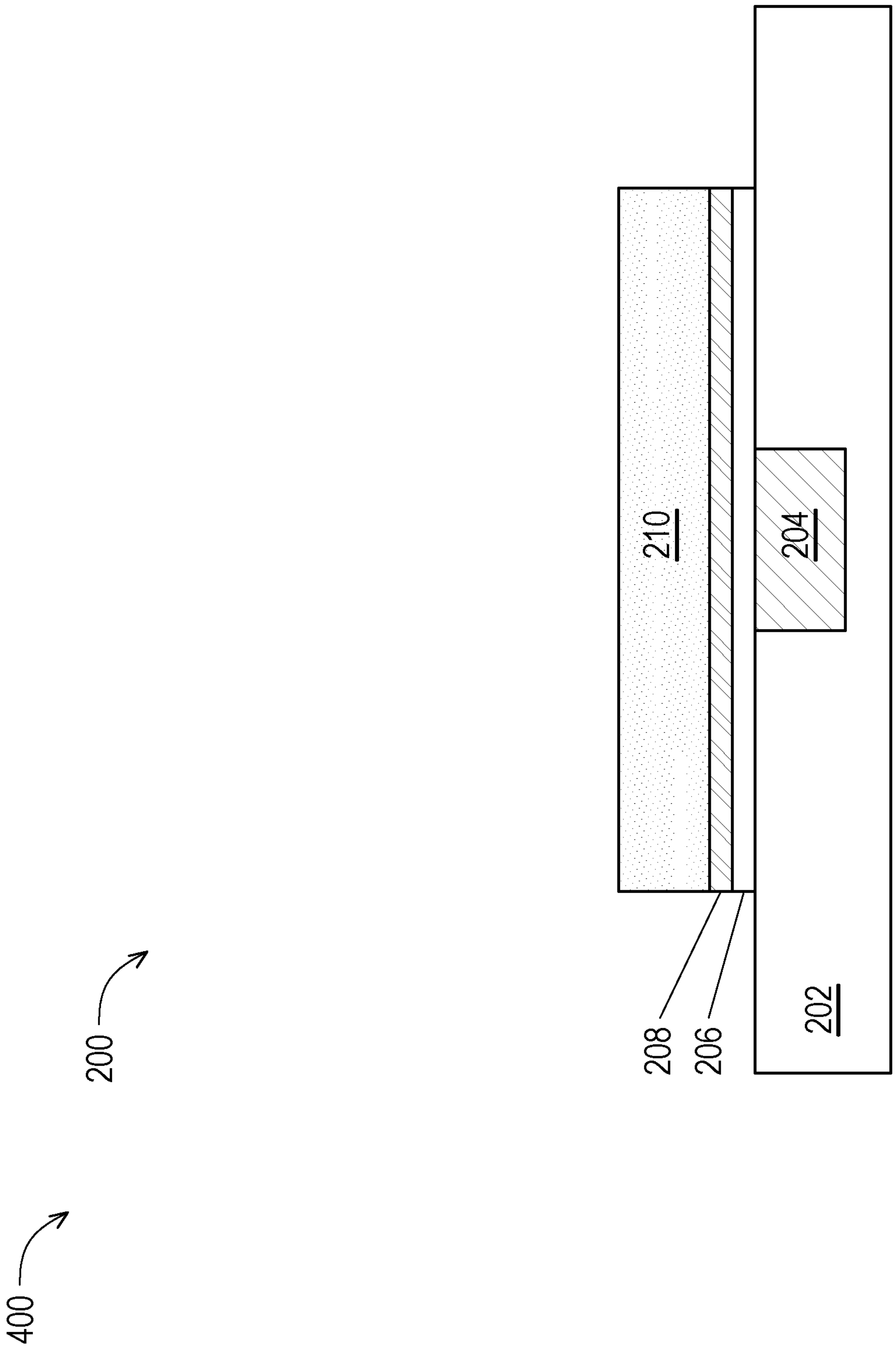

As shown in FIG. 4E, the ferroelectric layer 210 may be formed over and/or on the seed layer 208. The seed layer 208 facilitates growth of the ferroelectric layer 210 in a particular crystal structure and/or to a particular grain size. A deposition tool 102 may be used to deposit the ferroelectric layer 210 using an ALD technique, a CVD technique, a PVD technique, another deposition technique described above in connection with FIG. 1, and/or a deposition technique other than as described above in connection with FIG. 1. In some implementations, a planarization tool 110 may perform a CMP operation to planarize the ferroelectric layer 210 after the ferroelectric layer 210 is deposited.

Figure 4F:
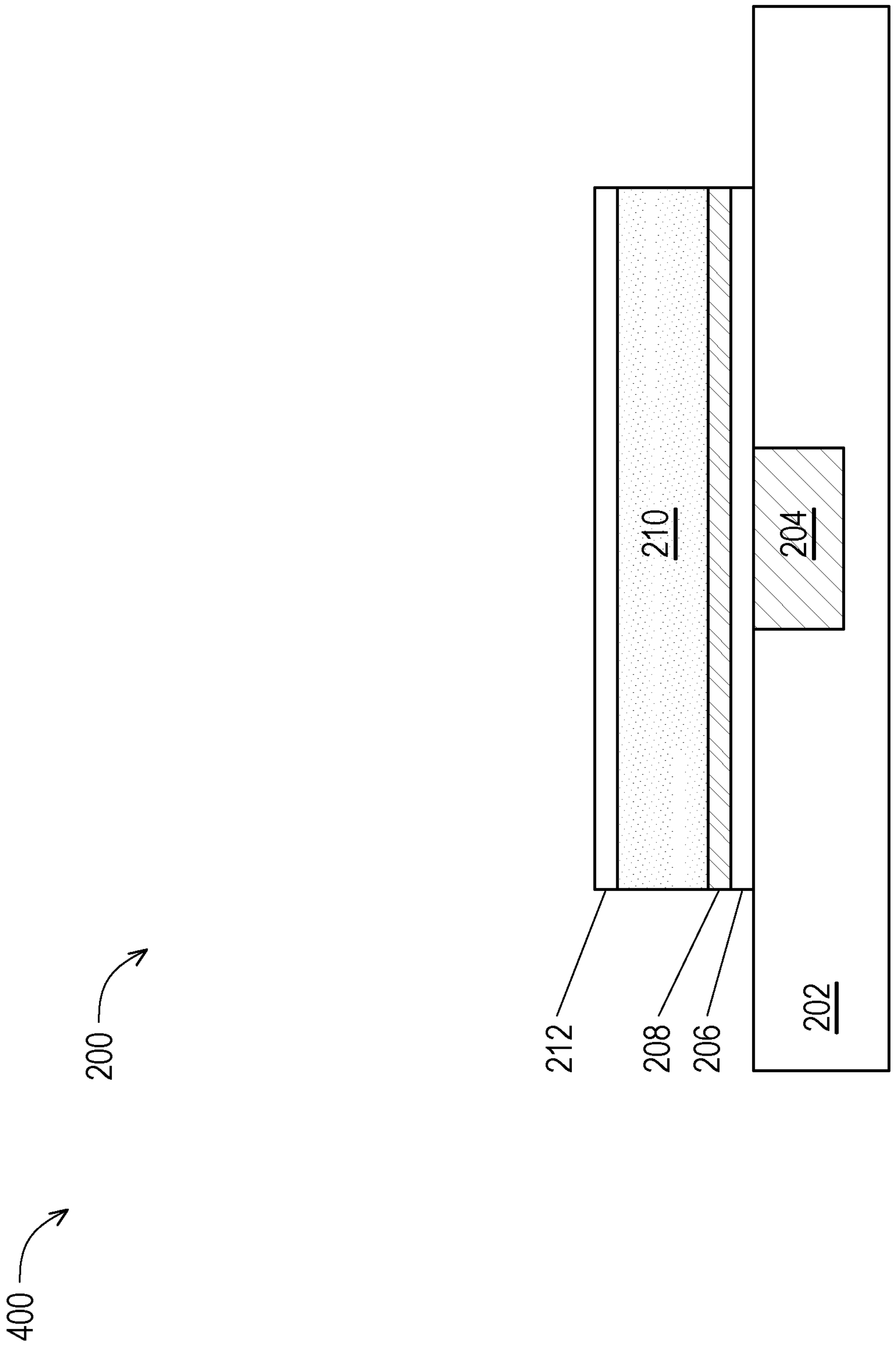

As shown in FIG. 4F, the blocking layer 212 may be formed over and/or on the ferroelectric layer 210. A deposition tool 102 may be used to deposit the blocking layer 212 using an ALD technique, a CVD technique, a PVD technique, another deposition technique described above in connection with FIG. 1, and/or a deposition technique other than as described above in connection with FIG. 1. In some implementations, a planarization tool 110 may perform a CMP operation to planarize the blocking layer 212 after the blocking layer 212 is deposited.

Figure 4G:
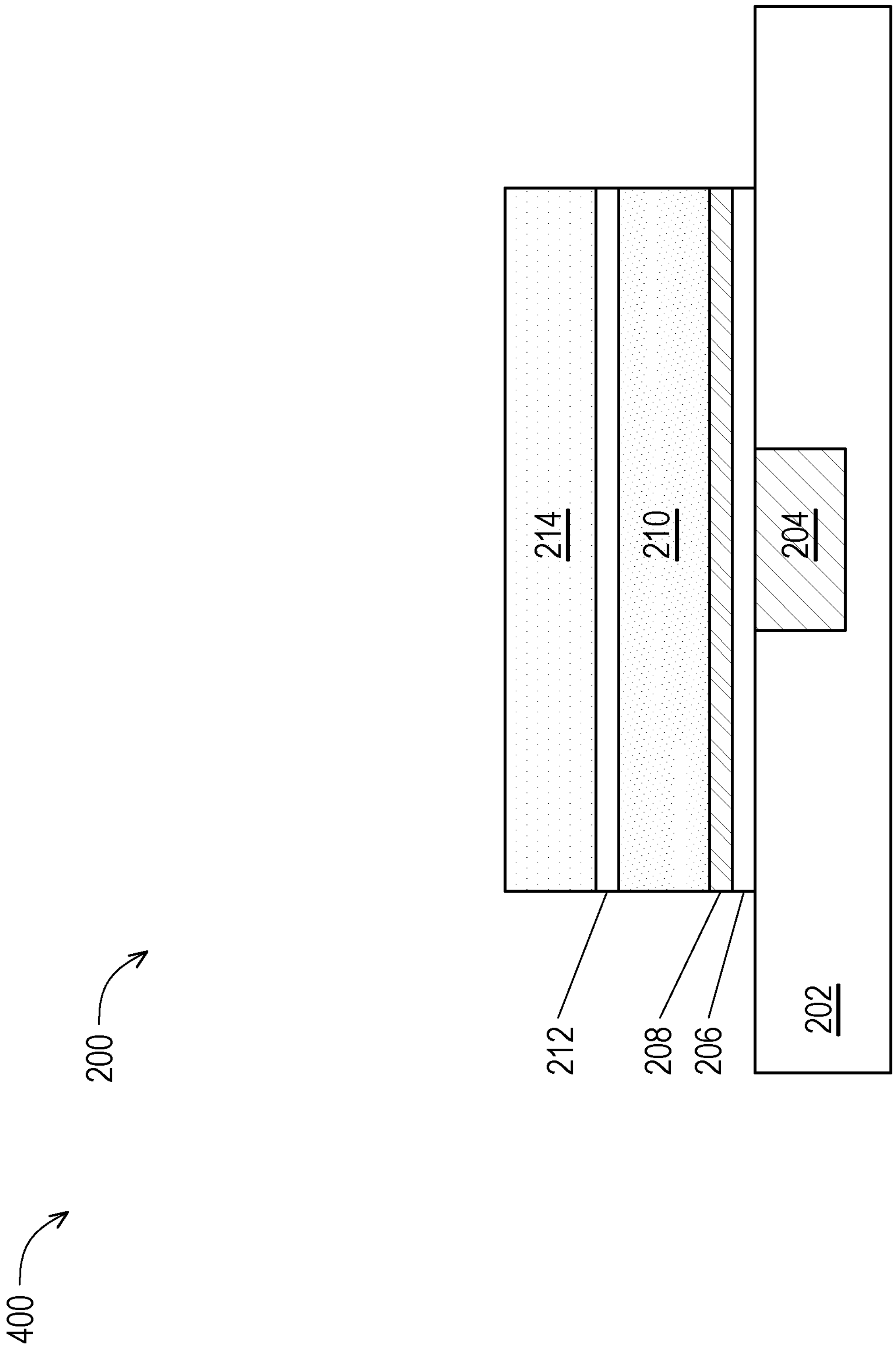

As shown in FIG. 4G, the metal-oxide channel layer 214 may be formed over and/or on the blocking layer 212. A deposition tool 102 may be used to deposit the metal-oxide channel layer 214 using an ALD technique, a CVD technique, a PVD technique, another deposition technique described above in connection with FIG. 1, and/or a deposition technique other than as described above in connection with FIG. 1. In some implementations, a planarization tool 110 may perform a CMP operation to planarize metal-oxide channel layer 214 after the metal-oxide channel layer 214 is deposited. In some implementations, a mixture of precursor gases (which may be referred to as a "cocktail") for depositing the ferroelectric layer 210 may be selected to achieve a suitable electron mobility and surface state for the ferroelectric layer 210. The mixture may include a mixture of solid metal precursors. The mixture may be vaporized using a low pressure vessel (LPV), and the resulting vaporized precursor mixture may be introduced (e.g., pulsed) into an ALD reaction chamber containing the non-volatile memory cell structure 200. The vaporized precursor mixture may react with the blocking layer 212 and/or the ferroelectric layer 210 when the metal-oxide channel layer 214 is deposited.

Figure 4H:
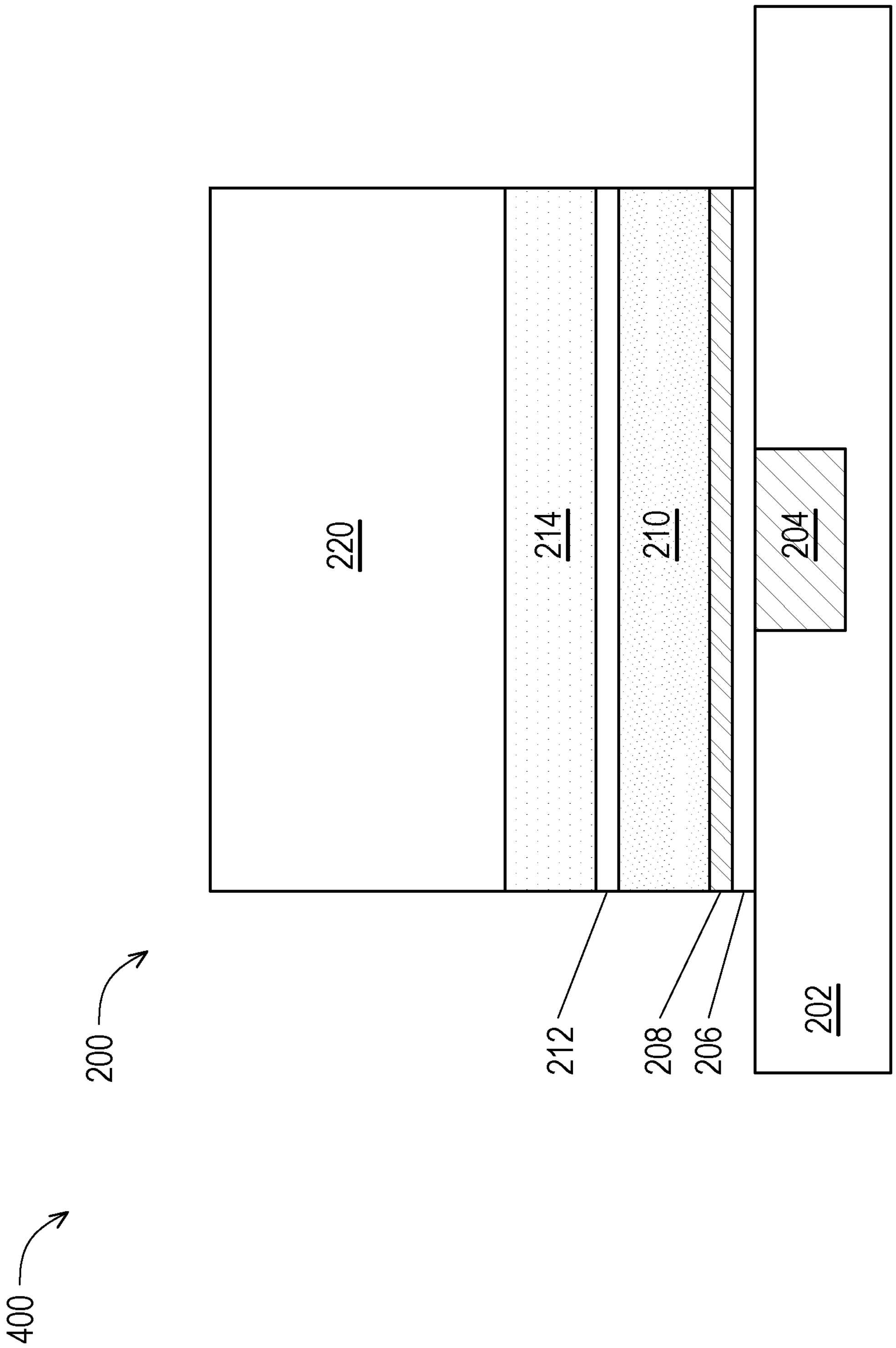

As shown in FIG. 4H, the dielectric layer 220 may be formed over and/or on the metal-oxide channel layer 214. A deposition tool 102 may be used to deposit the dielectric layer 220 using an ALD technique, a CVD technique, a PVD technique, an oxidation technique, another deposition technique described above in connection with FIG. 1, and/or a deposition technique other than as described above in connection with FIG. 1. In some implementations, a planarization tool 110 may perform a CMP operation to planarize the dielectric layer 220 after the dielectric layer 220 is deposited.

Figure 4I:
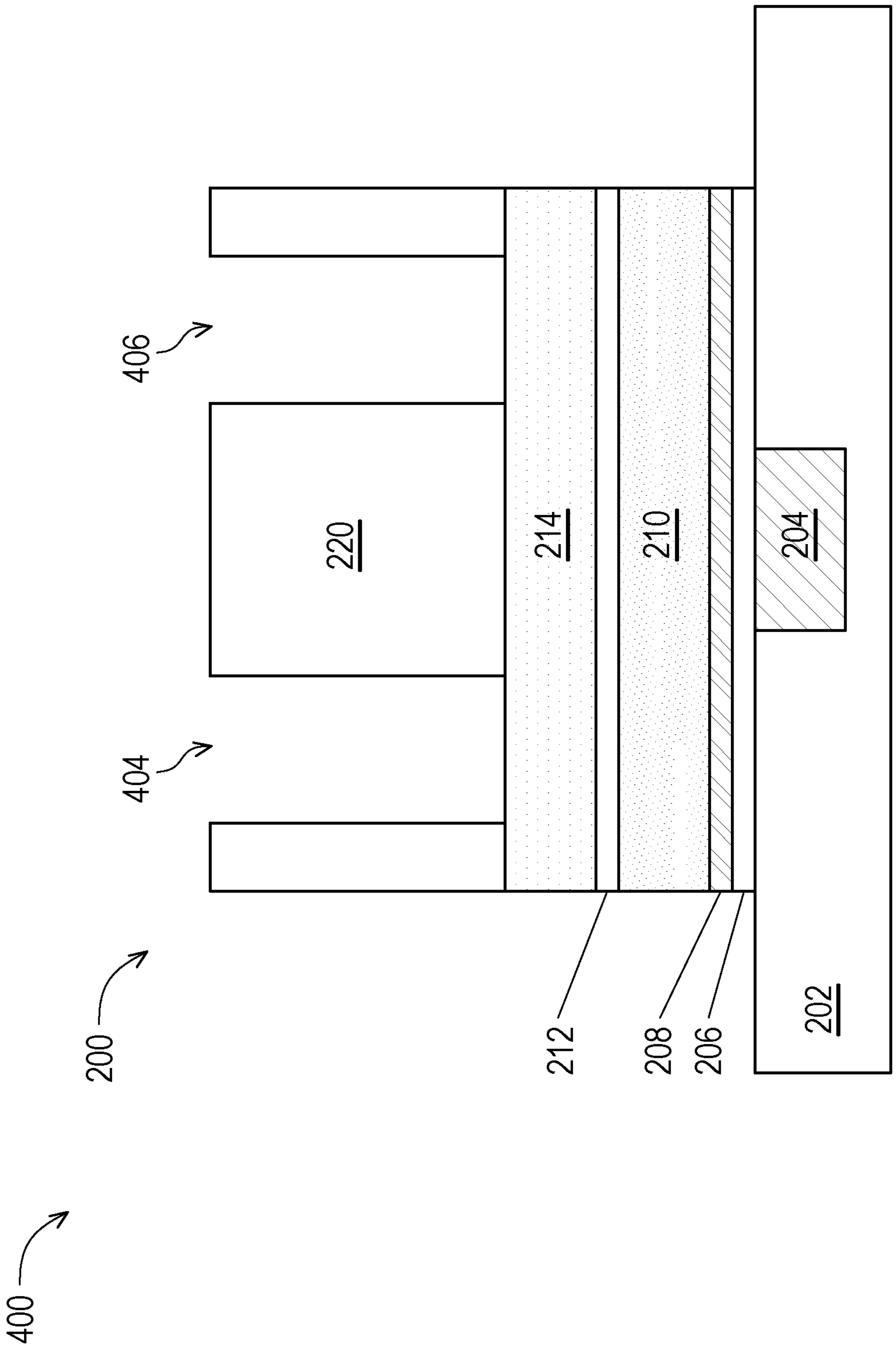

As shown in FIG. 4I, recesses 404 and 406 may be formed in and/or through the dielectric layer 220 such that the top surface of the metal-oxide channel layer 214 is exposed through the recesses 404 and 406. In some implementations, a pattern in a photoresist layer is used to etch the dielectric layer 220 to form the recesses 404 and 406. In these implementations, the deposition tool 102 may be used to form the photoresist layer on the dielectric layer 220. The exposure tool 104 may be used to expose the photoresist layer to a radiation source to pattern the photoresist layer. The developer tool 106 may be used to develop and remove portions of the photoresist layer to expose the pattern. The etch tool 108 may be used to etch the dielectric layer 220 based on the pattern to form the recesses 404 and 406 in the dielectric layer 220. In some implementations, the etch operation includes a plasma etch operation, a wet chemical etch operation, and/or another type of etch operation. In some implementations, a photoresist removal tool may be used to remove the remaining portions of the photoresist layer (e.g., using a chemical stripper, plasma ashing, and/or another technique). In some implementations, a hard mask layer is used as an alternative technique for etching the dielectric layer 220 based on a pattern.

Figure 4J:
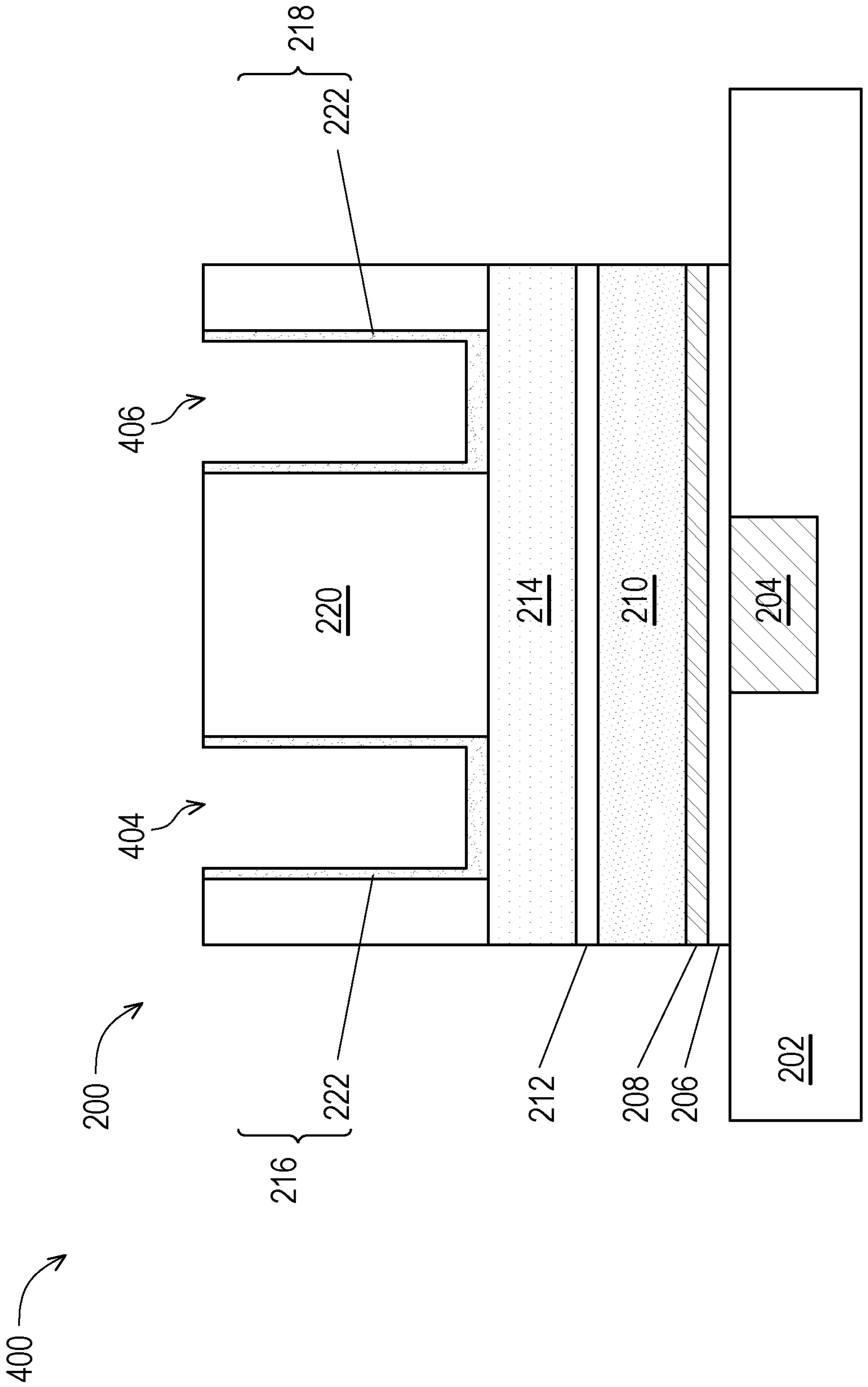

As shown in FIG. 4J, the electron barrier layers 222 of the source/drain regions 216 and 218 may be respectively formed in the recesses 404 and 406. A deposition tool 102 may be used to conformally deposit the electron barrier layers 222 using an ALD technique, a CVD technique, a PVD technique, another deposition technique described above in connection with FIG. 1, and/or a deposition technique other than as described above in connection with FIG. 1. The electron barrier layer 222 may be formed on the bottom surfaces of the recesses 404 and 406 corresponding to the top surface of the metal-oxide channel layer 214 exposed in the recesses 404 and 406. Moreover, the electron barrier layer 222 may be formed on the sidewalls of the recesses 404 and 406 corresponding to the dielectric layer 220.

Figure 4K:
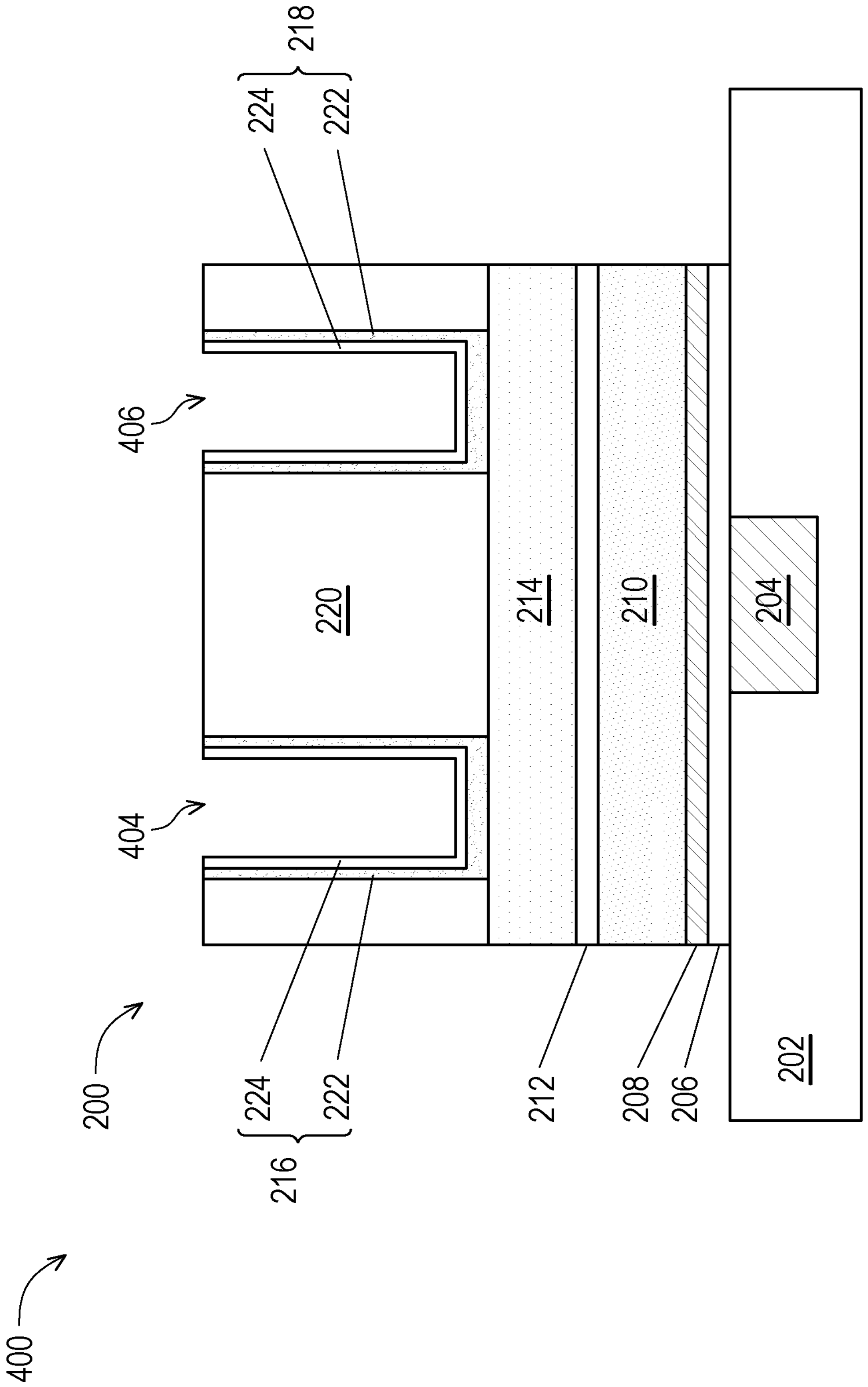

As shown in FIG. 4K, the oxide insertion layers 224 of the source/drain regions 216 and 218 may be respectively formed in the recesses 404 and 406. A deposition tool 102 may be used to conformally deposit the oxide insertion layers 224 using an ALD technique, a CVD technique, a PVD technique, another deposition technique described above in connection with FIG. 1, and/or a deposition technique other than as described above in connection with FIG. 1. The oxide insertion layers 224 may be formed on the electron barrier layers 222 over the bottom surfaces of the recesses 404 and 406. Moreover, the oxide insertion layers 224 may be formed on the electron barrier layers 222 over the sidewalls of the recesses 404 and 406 corresponding to the dielectric layer 220.

Figure 4L:
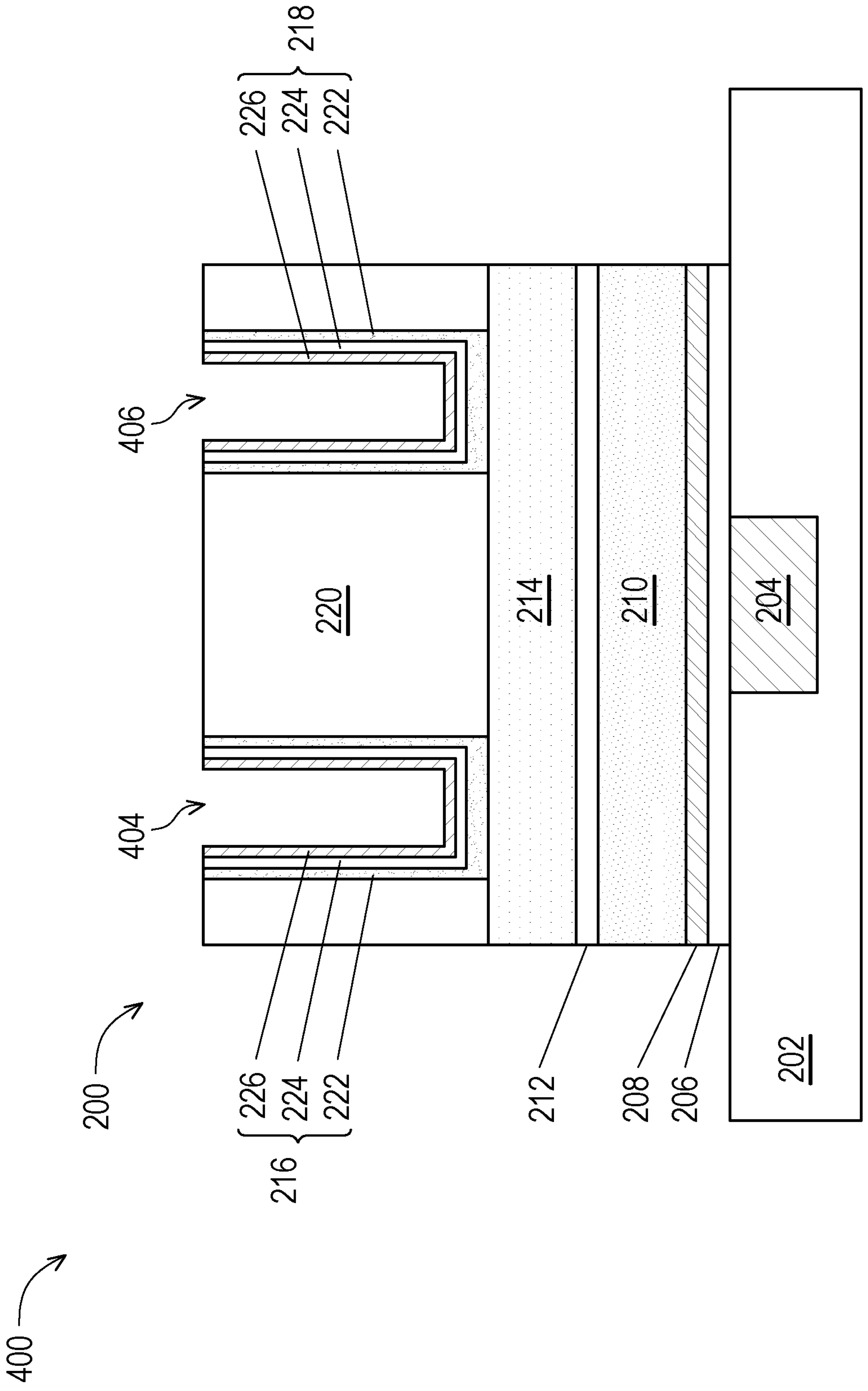

As shown in FIG. 4L, the metal glue layers 226 of the source/drain regions 216 and 218 may be respectively formed in the recesses 404 and 406. A deposition tool 102 may be used to conformally deposit the metal glue layers 226 using an ALD technique, a CVD technique, a PVD technique, another deposition technique described above in connection with FIG. 1, and/or a deposition technique other than as described above in connection with FIG. 1. The metal glue layers 226 may be formed on the oxide insertion layers 224 over the bottom surfaces of the recesses 404 and

406. Moreover, the metal glue layers 226 may be formed on the oxide insertion layers 224 over the sidewalls of the recesses 404 and 406 corresponding to the dielectric layer 220.

Figure 4M:
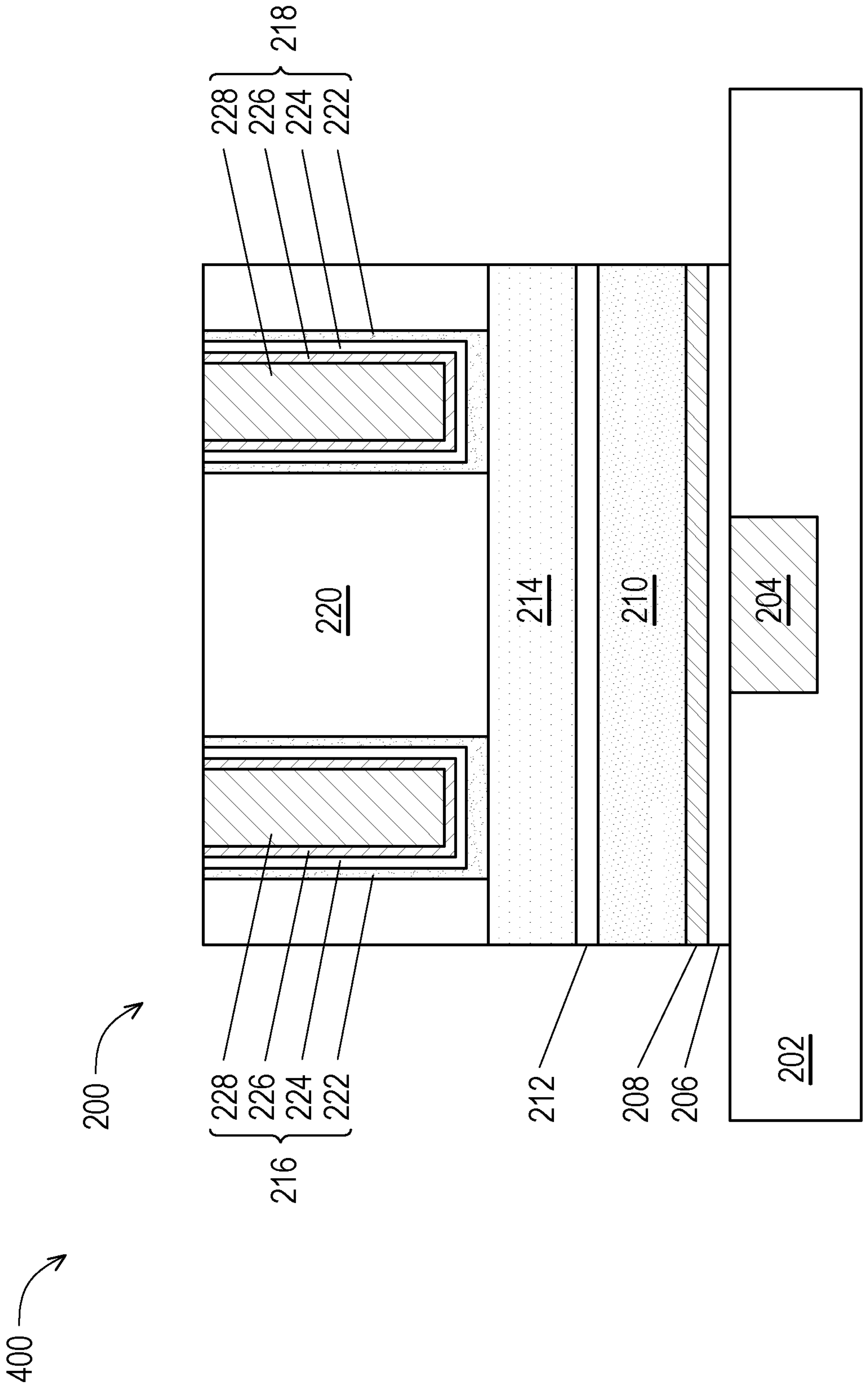

As shown in FIG. 4M, the source/drain electrodes 228 of the source/drain regions 216 and 218 may be respectively formed in the recesses 404 and 406. A deposition tool 102 and/or a plating tool 112 may be used to deposit the source/drain electrodes 228 using a CVD technique, a PVD technique, an ALD technique, an electroplating technique, another deposition technique described above in connection with FIG. 1, and/or another suitable deposition technique. The source/drain electrodes 228 may fill the remaining area of the recesses 404 and 406. In some implementations, the planarization tool 110 may be used to planarize the source/drain electrodes 228 after the source/drain electrodes 228 are deposited.

In some implementations, a quasi-ALD technique is used to deposit the source/drain electrodes 228 of the source/drain regions 216 and 218. The quasi-ALD technique includes the use of a CVD tool (e.g., a deposition tool 102) in which a pulse-purge tungsten (PPW) process is performed in an ALD-like manner.

Figure 4N:
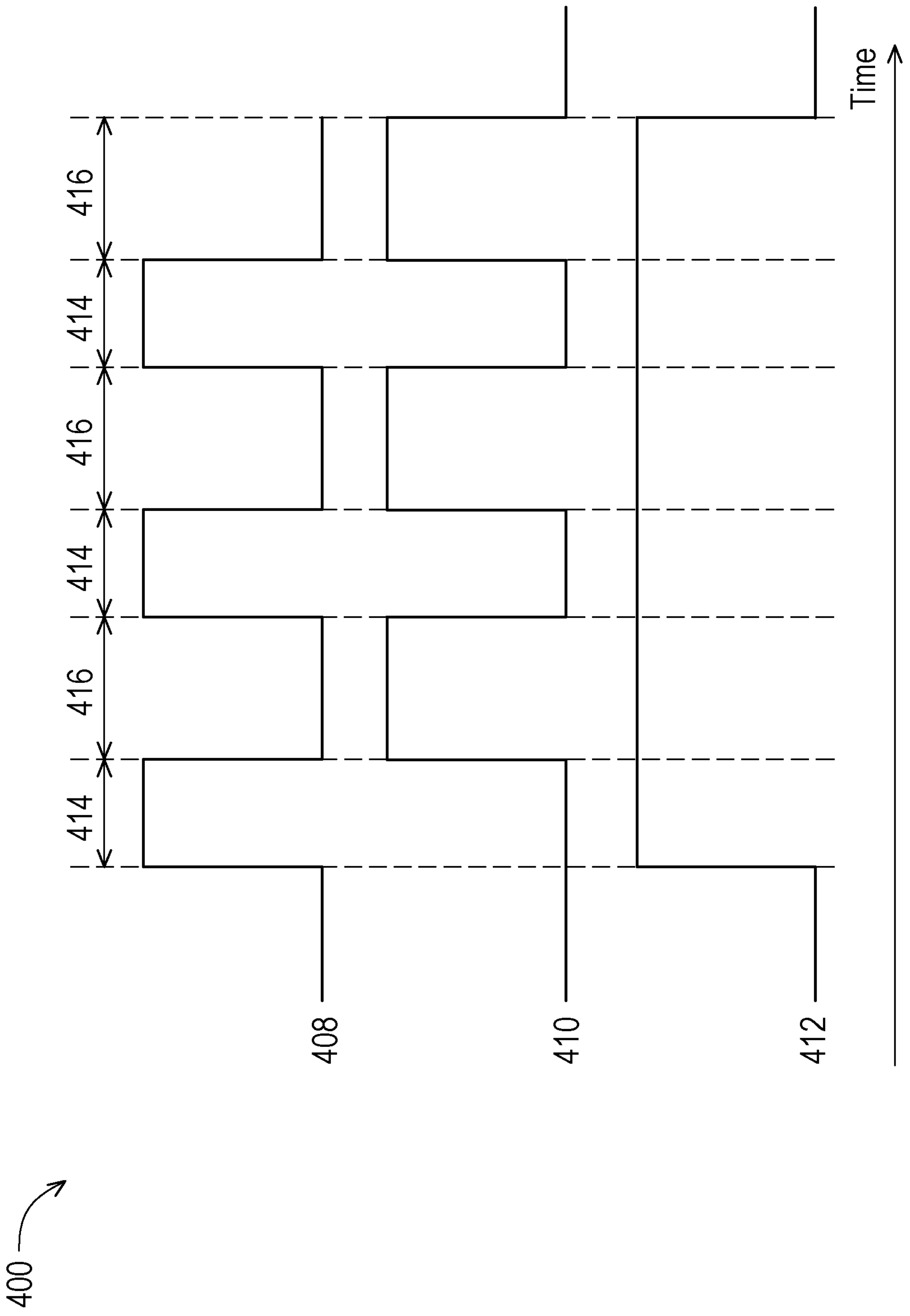
Figure 40:
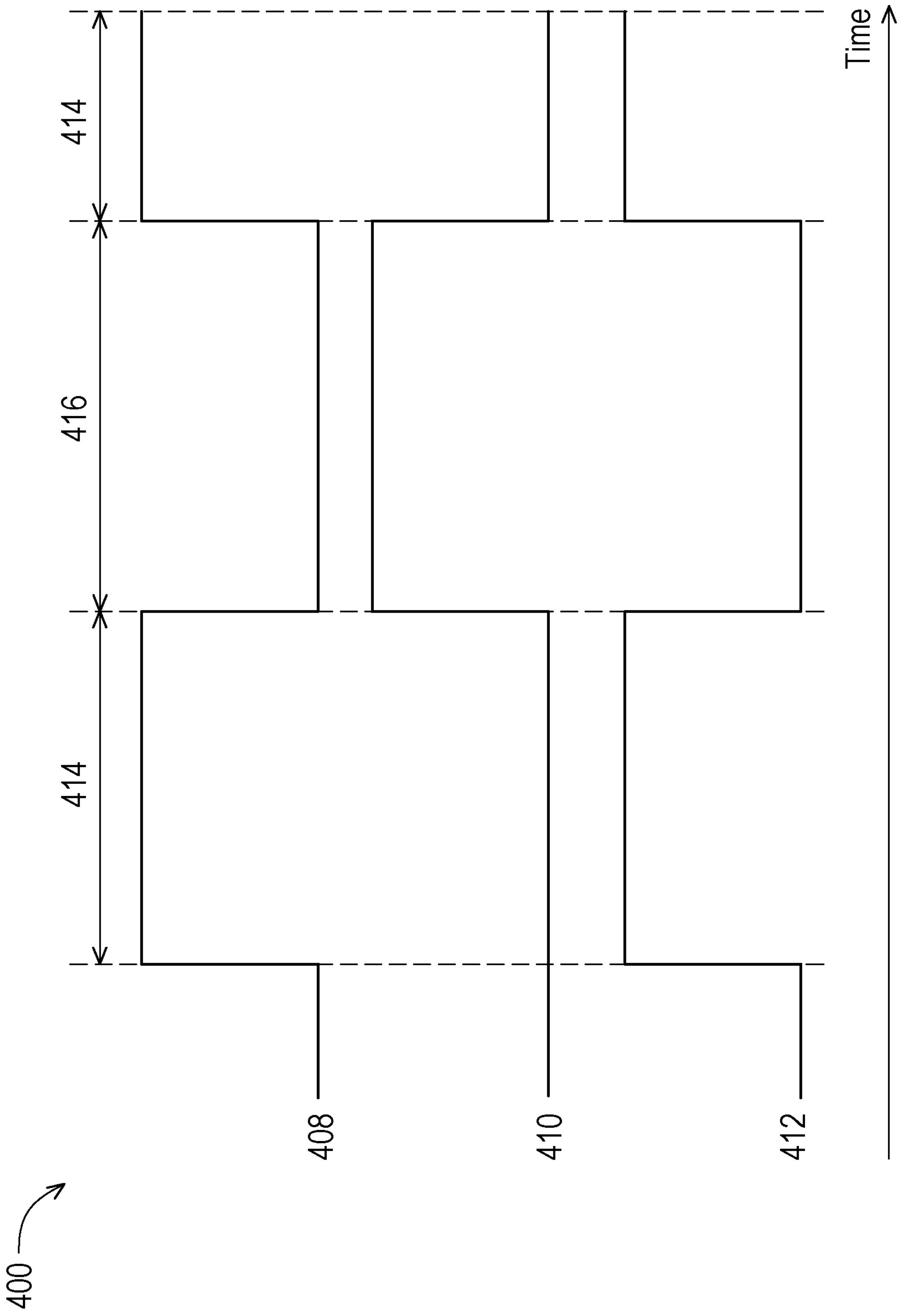

FIG. 4N illustrates an example quasi-ALD operation. As shown in FIG. 4N, the quasi-ALD operation may include a plurality of precursor gas pulse durations 414 that are performed using a metal precursor gas supply 408. During a precursor gas pulse duration 414, the metal precursor gas supply 408 is supplied to the processing chamber of the CVD tool. The precursor gas pulse durations 414 may be spaced apart in time by a plurality of nitrogen ($N_2$) gas purges 416. During a nitrogen gas purge 416, the supply of the metal precursor gas supply 408 is shut off, and a nitrogen gas supply 410 is provided to the processing chamber of the CVD tool to purge the remaining metal precursor gas supply 408 from the processing chamber. The precursor gas pulse durations 414 and the nitrogen gas purges 416 are performed in a cyclic manner across a time duration of continuous flow-in of a hydrogen ($H_2$) reactant gas 412 to the processing chamber of the CVD tool.

The use of the precursor gas pulse durations 414 and the nitrogen gas purges 416 across the continuous flow-in of the hydrogen reactant gas 412 may enable a larger grain size to be achieved for the source/drain electrodes 228 than without the use of the quasi-ALD technique. The absorption of the metal precursor gas supply 408 (which may include tungsten hexafluoride ($WF_6$), for example) may be self-limiting in that the fluorine in the metal precursor gas supply 408 limits further growth of tungsten of the source/drain electrodes. Thus, the metal precursor gas supply 408 may be pulsed for a relatively short time duration in a precursor gas pulse duration 414 to achieve a monolayer of chemisorbed tungsten hexafluoride, followed by a nitrogen gas purge 416 to remove residual metal precursor gas supply 408. The time duration of the nitrogen gas purge 416 may be greater than the time duration of the precursor gas pulse duration 414 to allow the hydrogen reactant gas 412 to primarily react with the chemisorbed tungsten hexafluoride, which results in the formation of tungsten (W) and a hydrofluoric acid (HF) byproduct (e.g., $WF_6+3\ H_2 \rightarrow W+6\ HF$). For example, the time duration of the precursor gas pulse duration 414 may be included in a range of approximately 0.5 seconds to approximately 3 seconds, whereas the time duration of the nitrogen gas purge 416 may be included in a range of approximately 5 seconds to approximately 10 seconds. As another example, a ratio of a time duration of a nitrogen gas purge 416 to a time duration of a precursor gas pulse duration 414 may be included in a range of approximately 5:3 to approximately 20:1. However, other values for these ranges are within the scope of the present disclosure. The hydrogen reactant gas 412 may be continuously supplied for a time duration that is included in a range of approximately 10 seconds to approximately 30 seconds before being stopped to allow a chamber purge to be performed to remove residual hydrogen reactant gas 412, residual tungsten precursors, and/or residual hydrofluoric acid byproducts from the processing chamber of the CVD tool.

Thus, using the nitrogen gas purges 416 during the continuous flow of the hydrogen reactant gas 412 enables monolayers of chemisorbed tungsten hexafluoride to be quickly formed and converted to deposited tungsten, which reduces the deposition rate impact of the self-limiting property of tungsten hexafluoride. In this way, the quasi-ALD technique described herein may increase the deposition rate of the material of the source/drain electrodes 228, which may enable a larger grain size to be achieved for the source/drain electrodes 228.

In some implementations, a combination of the quasi-ALD technique and a non-quasi-ALD CVD technique may be used to form the source/drain electrodes 228 of the source/drain regions 216 and 218. For example, the quasi-ALD technique described in connection with FIG. 4N may be used to form a first portion of a source/drain electrode 228 over and/or on a metal glue layer 226, and non-quasi-ALD CVD technique described in connection with FIG. 4O may be used to form a second portion of the source/drain electrode 228 over and/or on the first portion. The first portion may enable a low electrical resistance to be achieved for the source/drain electrode 228, and the second portion (having a smaller grain size than the grain size of the first portion) may enable improved gap filling performance and low stress to be achieved for the source/drain electrode 228. In some implementations, a ratio of the thickness of the first portion to a thickness of the second portion may be included in a range of approximately 1:1 to approximately 1:2. However, other values for the range are within the scope of the present disclosure.

As shown in FIG. 4O, the non-quasi-ALD CVD technique may include precursor gas pulse durations 414 and nitrogen gas purges 416. However, until the quasi-ALD technique described in connection with FIG. 4N, the precursor gas pulse durations 414 and the nitrogen gas purges 416 are not cycled across a continuous supply of the hydrogen reactant gas 412. Instead, the metal precursor gas supply 408 and the hydrogen reactant gas 412 are supplied to the processing chamber of the CVD tool during the precursor gas pulse durations 414 without the use of the nitrogen gas supply 410. The nitrogen gas supply 410 is only supplied during the nitrogen gas purges 416, during which the metal precursor gas supply 408 and the hydrogen reactant gas 412 are not supplied to the processing chamber of the CVD tool. Moreover, the time duration of the precursor gas pulse durations 414 for the non-quasi-ALD CVD technique is greater than the time duration of the precursor gas pulse durations 414 for the quasi-ALD technique. For example, the time duration of the precursor gas pulse durations 414 for the non-quasi-ALD CVD technique may be included in a range of approximately 10 seconds to approximately 30 seconds, whereas the time duration of the precursor gas pulse durations 414 for the quasi-ALD technique may be included in a range of approximately 0.5 seconds to approximately 3 seconds. However, other values for these range are within the scope of the present disclosure.

As indicated above, FIGS. 4A-4O are provided as an example. Other examples may differ from what is described with regard to FIGS. 4A-4O.

FIGS. 5A-5D are diagrams of examples of elemental compositions of source/drain electrodes 228 described herein. The examples of elemental compositions are illustrated for a non-volatile memory cell structure in which source/drain electrodes 228 are formed without the use of the quasi-ALD technique described in connection with FIG. 4N, and for the non-volatile memory cell structure 200 (in which the quasi-ALD technique described in connection with FIG. 4N is used to form the source/drain electrodes 228).

Figure 5A:
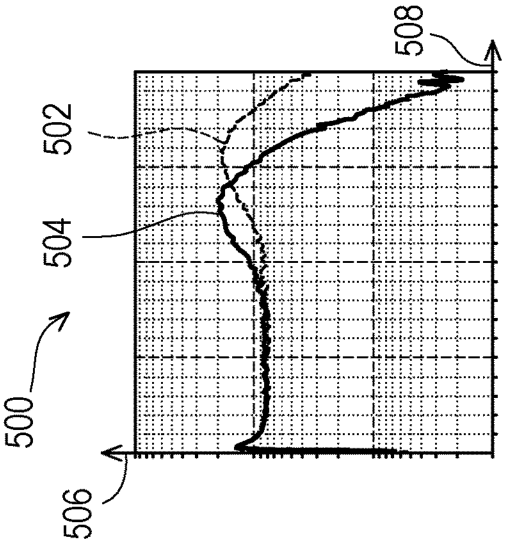
FIGS. 5A-5D are diagrams of examples of elemental compositions of source/drain electrodes described herein.

FIG. 5A illustrates an example 500 of tungsten (W) compositions for the non-volatile memory cell structure in which source/drain electrodes 228 are formed without the use of the quasi-ALD technique described in connection with FIG. 4N (corresponding to data plot 502) and for the non-volatile memory cell structure 200 (corresponding to data plot 504). The tungsten compositions are illustrated as a function of elemental intensity 506 and depth 508 in the source/drain electrodes 228. As illustrated in FIG. 5A, tungsten compositions of the non-volatile memory cell structure in which source/drain electrodes 228 are formed without the use of the quasi-ALD technique described in connection with FIG. 4N and of the non-volatile memory cell structure 200 are similar, meaning that the quasi-ALD technique described in connection with FIG. 4N does not adversely impact the tungsten composition of the source/drain electrodes 228 in the non-volatile memory cell structure 200.

Figure 5B:
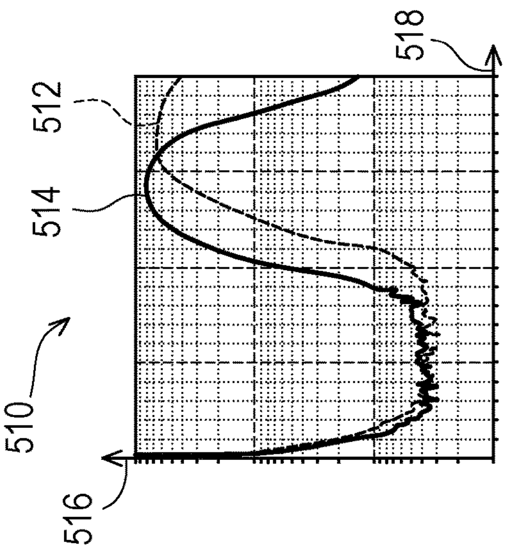

FIG. 5B illustrates an example 510 of hydrogen ($H_2$) compositions for the non-volatile memory cell structure in which source/drain electrodes 228 are formed without the use of the quasi-ALD technique described in connection with FIG. 4N (corresponding to data plot 512) and for the non-volatile memory cell structure 200 (corresponding to data plot 514). The hydrogen compositions are illustrated as a function of elemental intensity 516 and depth 518 in the source/drain electrodes 228. As illustrated in FIG. 5B, hydrogen compositions of the non-volatile memory cell structure in which source/drain electrodes 228 are formed without the use of the quasi-ALD technique described in connection with FIG. 4N and of the non-volatile memory cell structure 200 are similar, meaning that the quasi-ALD technique described in connection with FIG. 4N does not adversely impact the hydrogen composition of the source/drain electrodes 228 in the non-volatile memory cell structure 200.

Figure 5C:
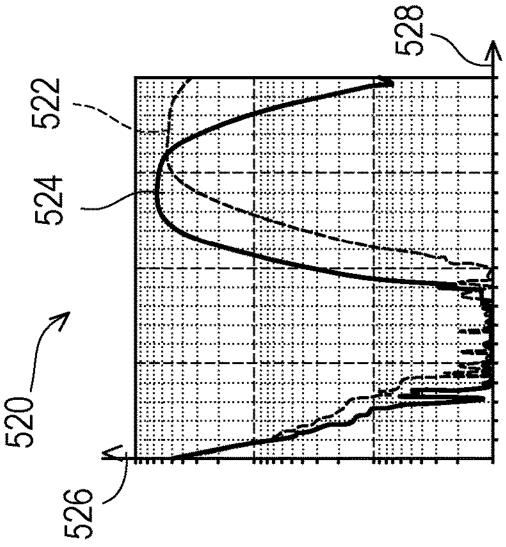

FIG. 5C illustrates an example 520 of oxygen ($O_2$) compositions for the non-volatile memory cell structure in which source/drain electrodes 228 are formed without the use of the quasi-ALD technique described in connection with FIG. 4N (corresponding to data plot 522) and for the non-volatile memory cell structure 200 (corresponding to data plot 524). The oxygen compositions are illustrated as a function of elemental intensity 526 and depth 528 in the source/drain electrodes 228. As illustrated in FIG. 5C, oxygen compositions of the non-volatile memory cell structure in which source/drain electrodes 228 are formed without the use of the quasi-ALD technique described in connection with FIG. 4N and of the non-volatile memory cell structure 200 are similar, meaning that the quasi-ALD technique described in connection with FIG. 4N does not adversely impact the oxygen composition of the source/drain electrodes 228 in the non-volatile memory cell structure 200.

Figure 5D:
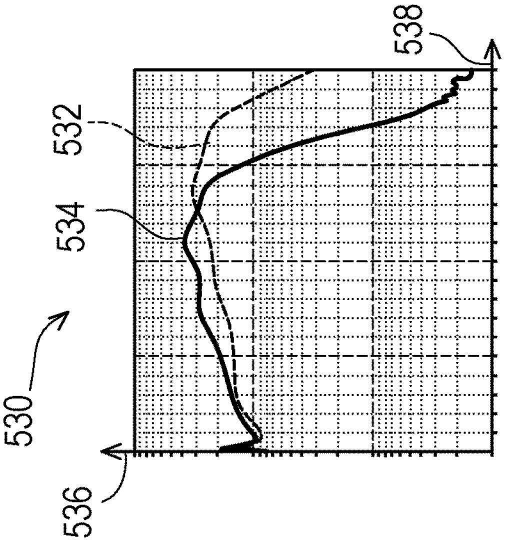

FIG. 5D illustrates an example 530 of fluorine (F) compositions for the non-volatile memory cell structure in which source/drain electrodes 228 are formed without the use of the quasi-ALD technique described in connection with FIG. 4N (corresponding to data plot 532) and for the non-volatile memory cell structure 200 (corresponding to data plot 534). The fluorine compositions are illustrated as a function of elemental intensity 536 and depth 538 in the source/drain electrodes 228. As illustrated in FIG. 5B, fluorine compositions of the non-volatile memory cell structure in which source/drain electrodes 228 are formed without the use of the quasi-ALD technique described in connection with FIG. 4N and of the non-volatile memory cell structure 200 are similar, meaning that the quasi-ALD technique described in connection with FIG. 4N does not adversely impact the fluorine composition of the source/drain electrodes 228 in the non-volatile memory cell structure 200.

As indicated above, FIGS. 5A-5D are provided as examples. Other examples may differ from what is described with regard to FIGS. 5A-5D.

Figure 6:
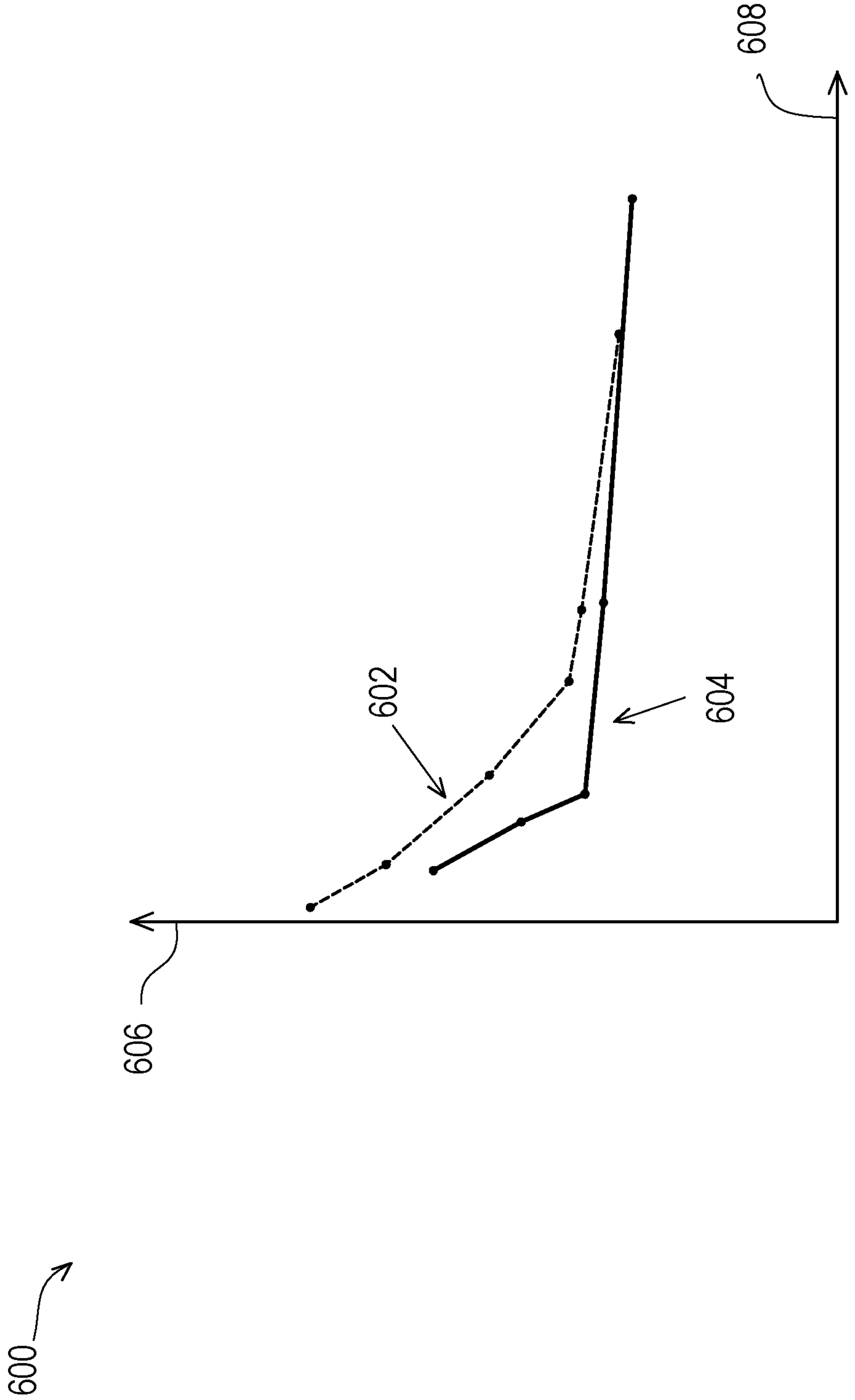
FIG. 6 is a diagram of an example of resistivities for source/drain electrodes described herein.

FIG. 6 is a diagram of an example 600 of resistivities for source/drain electrodes 228 described herein. The examples of resistivities are illustrated for a non-volatile memory cell structure in which source/drain electrodes 228 are formed without the use of the quasi-ALD technique described in connection with FIG. 4N (corresponding to data plot 602), and for the non-volatile memory cell structure 200 in which the quasi-ALD technique described in connection with FIG. 4N is used to form the source/drain electrodes 228 (corresponding to data plot 604). The resistivities are illustrated as a function of resistivity 606 and thickness 608 of the source/drain electrodes 228.

As shown in FIG. 6, the resistivity 606 of the source/drain electrodes 228 general decreases as the thickness 608 increases. However, because of the larger grain size achieved using of the quasi-ALD technique described in connection with FIG. 4N, the source/drain electrodes 228 of the non-volatile memory cell structure 200 is less for the same thickness 608 as the non-volatile memory cell structure in which the source/drain electrodes 228 are formed without the use of the quasi-ALD technique described in connection with FIG. 4N. For example, at a thickness of approximately 430 angstroms, the source/drain electrodes 228 of the non-volatile memory cell structure 200 may have a resistivity of approximately 16.9 ohm centimeters ((2-cm) compared to approximately 19.4 (2-cm for the source/drain electrodes 228 of the non-volatile memory cell structure in which the source/drain electrodes 228 are formed without the use of the quasi-ALD technique described in connection with FIG. 4N.

As indicated above, FIG. 6 is provided as an example. Other examples may differ from what is described with regard to FIG. 6.

Figure 7:
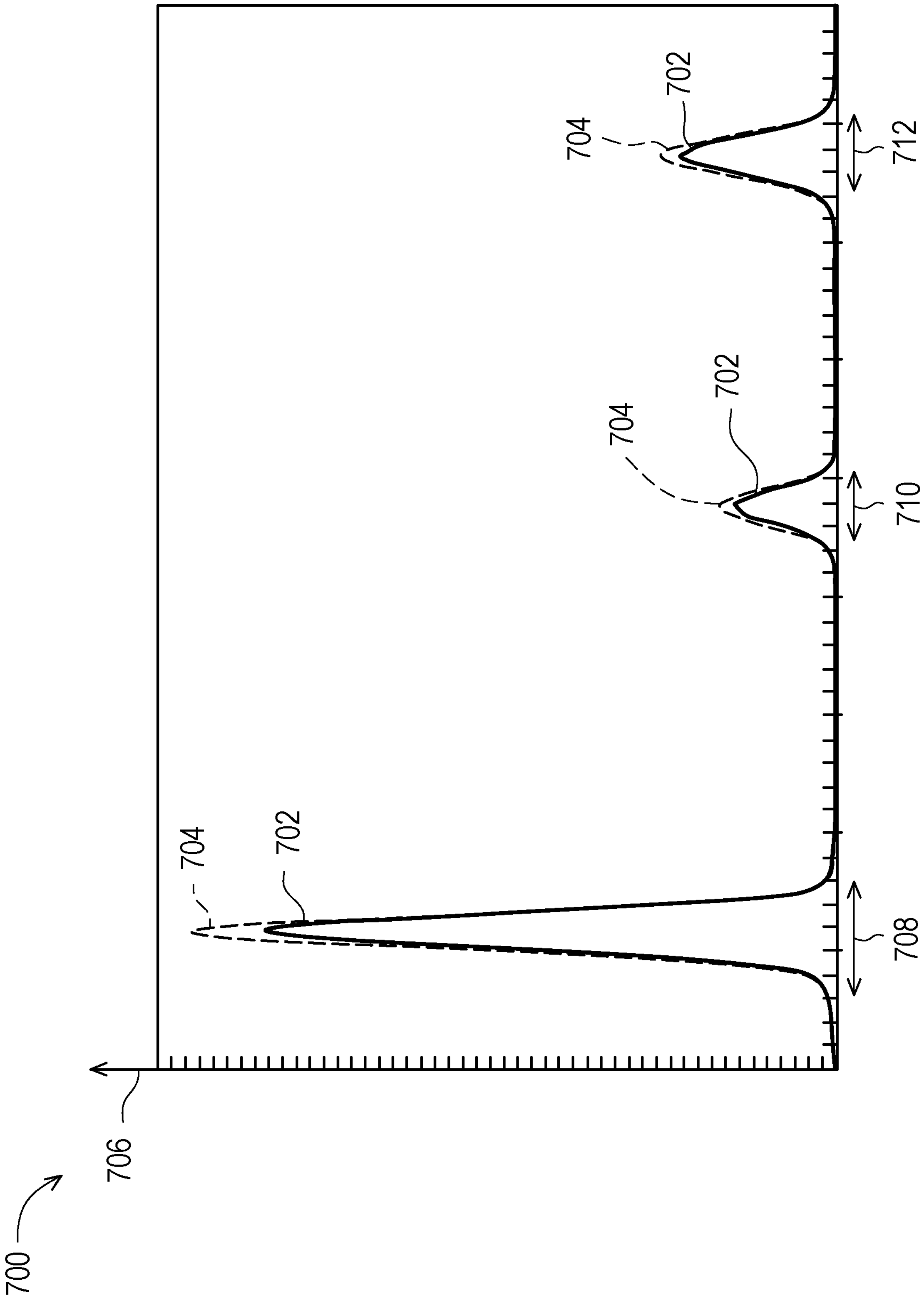
FIG. 7 is a diagram of an example of crystal phase composition for source/drain electrodes described herein.

FIG. 7 is a diagram of an example 700 of crystal phase compositions for source/drain electrodes 228 described herein. The examples of crystal phase compositions are illustrated for a non-volatile memory cell structure in which source/drain electrodes 228 are formed without the use of the quasi-ALD technique described in connection with FIG. 4N (corresponding to data plot 702), and for the non-volatile memory cell structure 200 in which the quasi-ALD technique described in connection with FIG. 4N is used to form the source/drain electrodes 228 (corresponding to data plot 704). The crystal phase compositions are illustrated as a function of phase intensity 706.

As shown in FIG. 7, the non-volatile memory cell structure in which source/drain electrodes 228 are formed without the use of the quasi-ALD technique described in connection with FIG. 4N, and for the non-volatile memory cell structure 200, both include crystal phase compositions with particular prominent crystal phases. The prominent crystal phases being a (110) crystal phase 708, a (200) crystal phase 710, and a (211) crystal phase 712, with the (110) crystal phase 708 having the greatest phase intensity 706. However, the quasi-ALD technique described in connection with FIG. 4N results in the source/drain electrodes 228 of the non-volatile memory cell structure 200 having the greater phase intensity 706 for the (110) crystal phase 708, the (200) crystal phase 710, and the (211) crystal phase 712; and particularly for the (110) crystal phase 708. This results in a larger grain size for the source/drain electrodes 228 of the non-volatile memory cell structure 200, which contributes to the lesser resistivity of the source/drain electrodes 228 of the non-volatile memory cell structure 200.

As indicated above, FIG. 7 is provided as an example. Other examples may differ from what is described with regard to FIG. 7.

Figure 8:
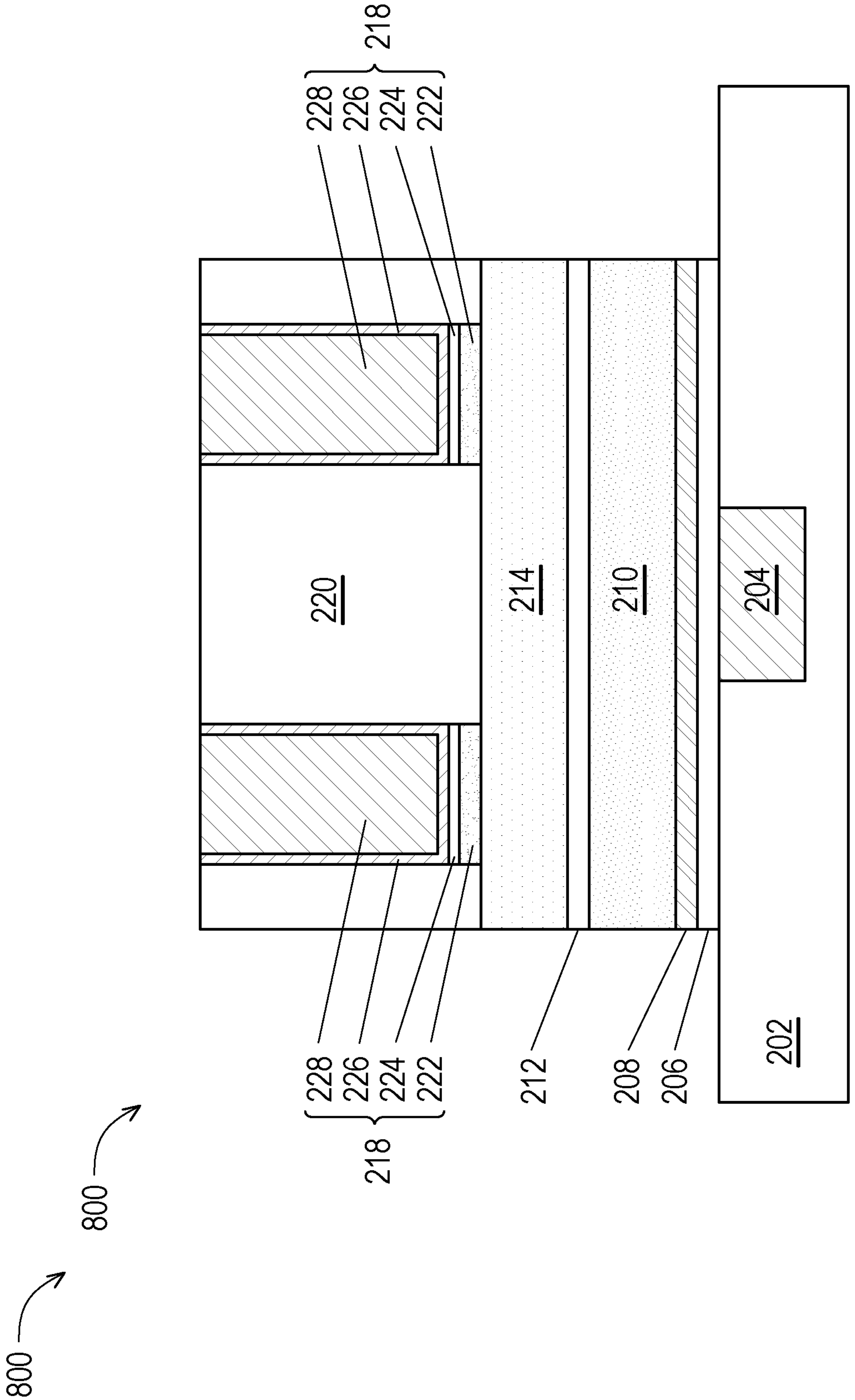
FIG. 8 is a diagram of an example non-volatile memory cell structure described herein.

FIG. 8 is a diagram of an example non-volatile memory cell structure 800 described herein. The non-volatile memory cell structure 200 may include a ferroelectric non-volatile memory cell structure such as an FeRAM cell. As described herein, the non-volatile memory cell structure 200 may include an oxide insertion layer that enables a metal glue layer to be formed over an electron barrier layer of the non-volatile memory cell structure 200 with low surface roughness, which may enable increased adhesion between the metal glue layer and source/drain electrodes of the source/drain regions of the non-volatile memory cell structure 200. In this way, the oxide insertion layer included in the non-volatile memory cell structure 200 may enable low electrical resistance to be achieved for the non-volatile memory cell structure 200 and/or may reduce the likelihood of failures in the non-volatile memory cell structure 200, among other examples.

As shown in FIG. 8, the non-volatile memory cell structure 800 may include a similar combination and arrangement of layers and/or structures as the non-volatile memory cell structure 200. However, in the non-volatile memory cell structure 800, the electron barrier layer 222 and the oxide insertion layer 224 are omitted from the sidewalls of the source/drain regions 216 and 218. In other words, the electron barrier layer 222 and the oxide insertion layer 224 are included only between the metal-oxide channel layer 214 and the bottom surface of the metal glue layer 226, and between the metal-oxide channel layer 214 and the bottom surface of the source/drain electrode 228. The metal glue layer 226 is included directly on the dielectric layer 220 between the dielectric layer 220 and the sidewalls of the source/drain electrode 228.

Omitting the electron barrier layer 222 and the oxide insertion layer 224 from the sidewalls of the source/drain electrodes 228 may provide a greater amount of volume for forming the source/drain electrodes 228 of the source/drain regions 216 and 218 while still providing electron barrier functions and intermixing blocking in the non-volatile memory cell structure 800. This may further reduce the electrical resistance of the source/drain regions 216 and 218. By comparison, leaving the electron barrier layer 222 and the oxide insertion layer 224 on the dielectric layer 220 may result in less manufacturing time, cost, and complexity for the non-volatile memory cell structure 200 because fewer etch back operations are performed when manufacturing the non-volatile memory cell structure 200 relative to the non-volatile memory cell structure 800.

As indicated above, FIG. 8 is provided as an example. Other examples may differ from what is described with regard to FIG. 8.

FIGS. 9A-9G are diagrams of an example implementation 900 of forming the non-volatile memory cell structure 800 described herein. In some implementations, one or more of the semiconductor processing operations described in connection with FIGS. 9A-9G may be performed using one or more of the semiconductor processing tools 102-112 described herein. In some implementations, one or more of the semiconductor processing operations described in connection with FIGS. 9A-9G may be performed using another type of semiconductor processing tool.

Figure 9A:
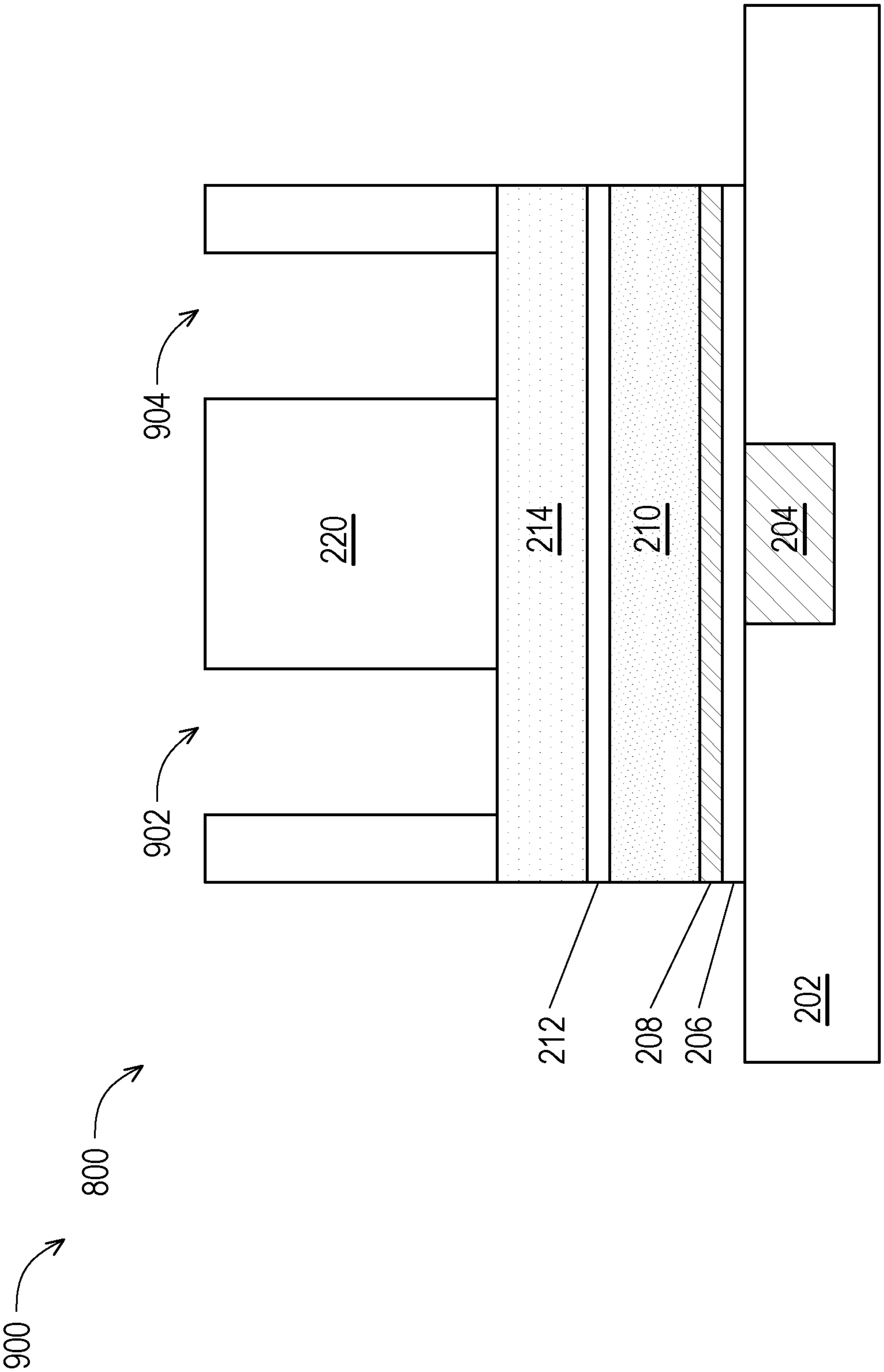
FIGS. 9A-9G are diagrams of an example implementation of forming the non-volatile memory cell structure described herein.

As shown in FIG. 9A, one or more of the semiconductor processing operations described in connection with FIGS. 4A-4I may be performed to form the elements 202-214 and 220 of the non-volatile memory cell structure 800, and to form recesses 902 and 904 in the dielectric layer 220.

Figure 9B:
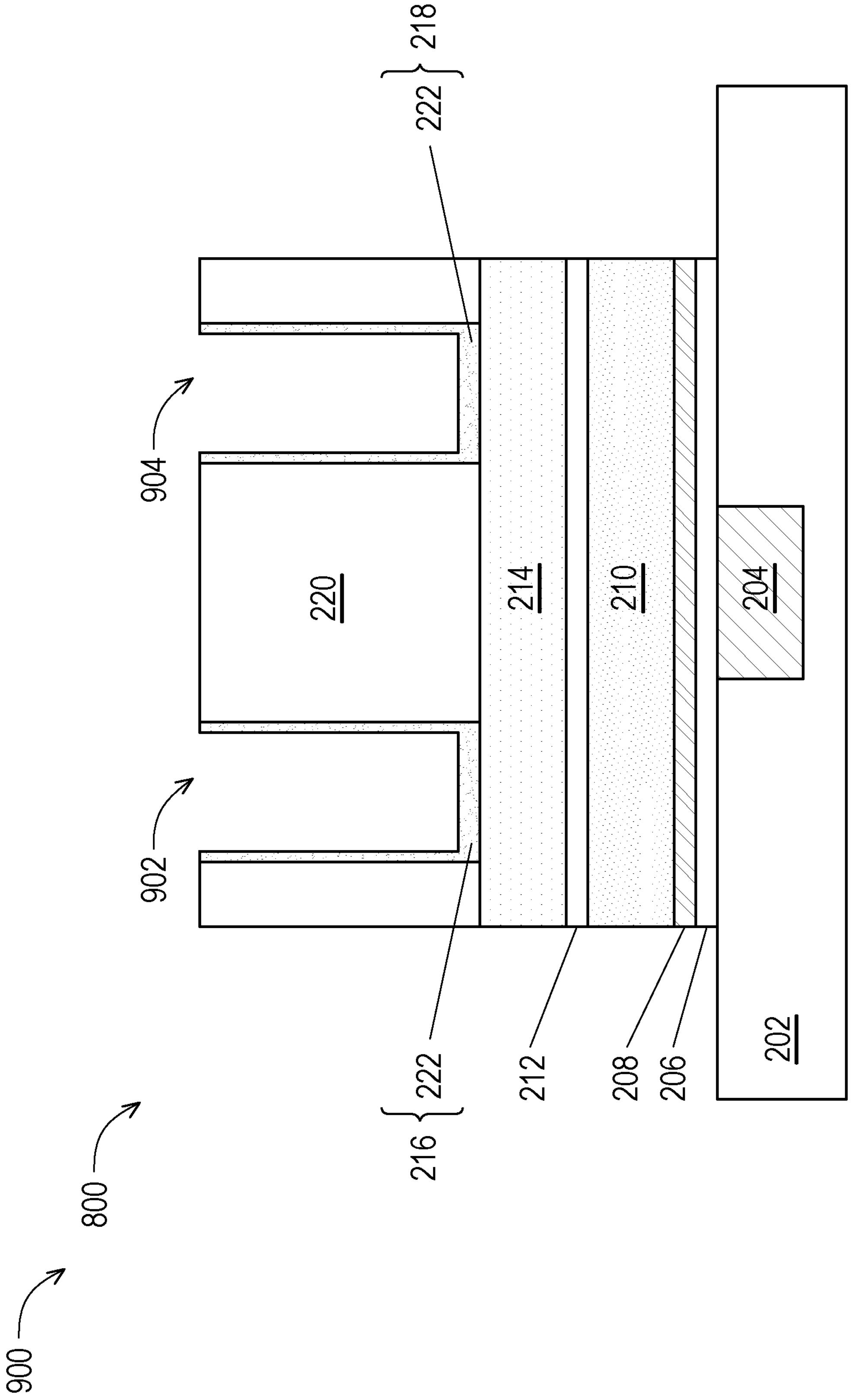

As shown in FIG. 9B, the electron barrier layers 222 of the source/drain regions 216 and 218 may be respectively formed in the recesses 404 and 406. A deposition tool 102 may be used to conformally deposit the electron barrier layers 222 using an ALD technique, a CVD technique, a PVD technique, another deposition technique described above in connection with FIG. 1, and/or a deposition technique other than as described above in connection with FIG. 1. The electron barrier layer 222 may be formed on the bottom surfaces of the recesses 404 and 406 corresponding to the top surface of the metal-oxide channel layer 214 exposed in the recesses 404 and 406. Moreover, the electron barrier layer 222 may be formed on the sidewalls of the recesses 404 and 406 corresponding to the dielectric layer 220.

Figure 9C:
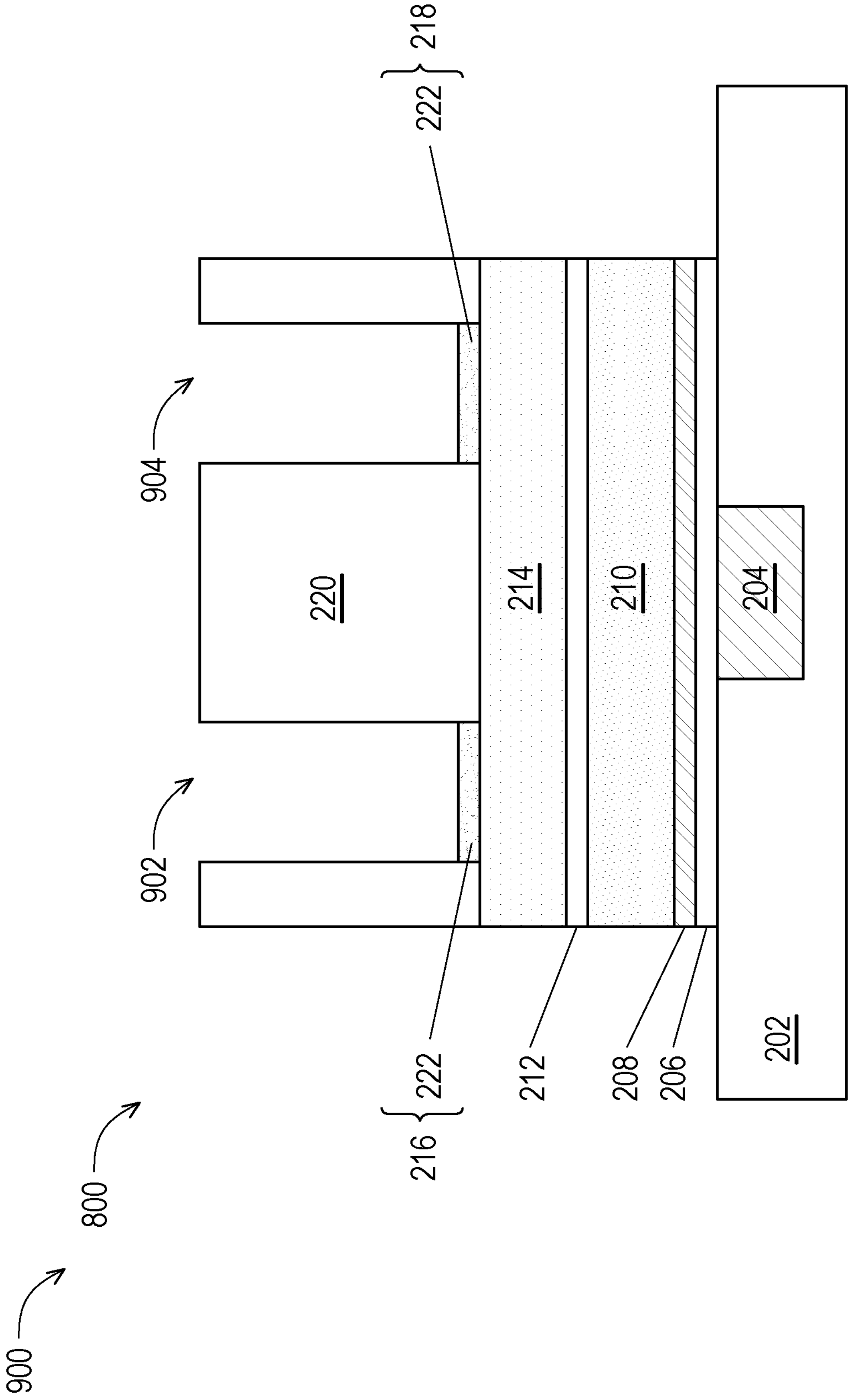

As shown in FIG. 9C, a first etch back operation may be performed to remove portions of the electron barrier layers 222 from the sidewalls of the recesses 902 and 904. An etch tool 108 may be used to perform the first etch back operation using a plasma etch technique, a wet chemical etch technique, and/or another type of etch technique. The electron barrier layers 222 may remain over and/or on the bottom surfaces of the recesses 902 and 904 after the first etch back operation.

Figure 9D:
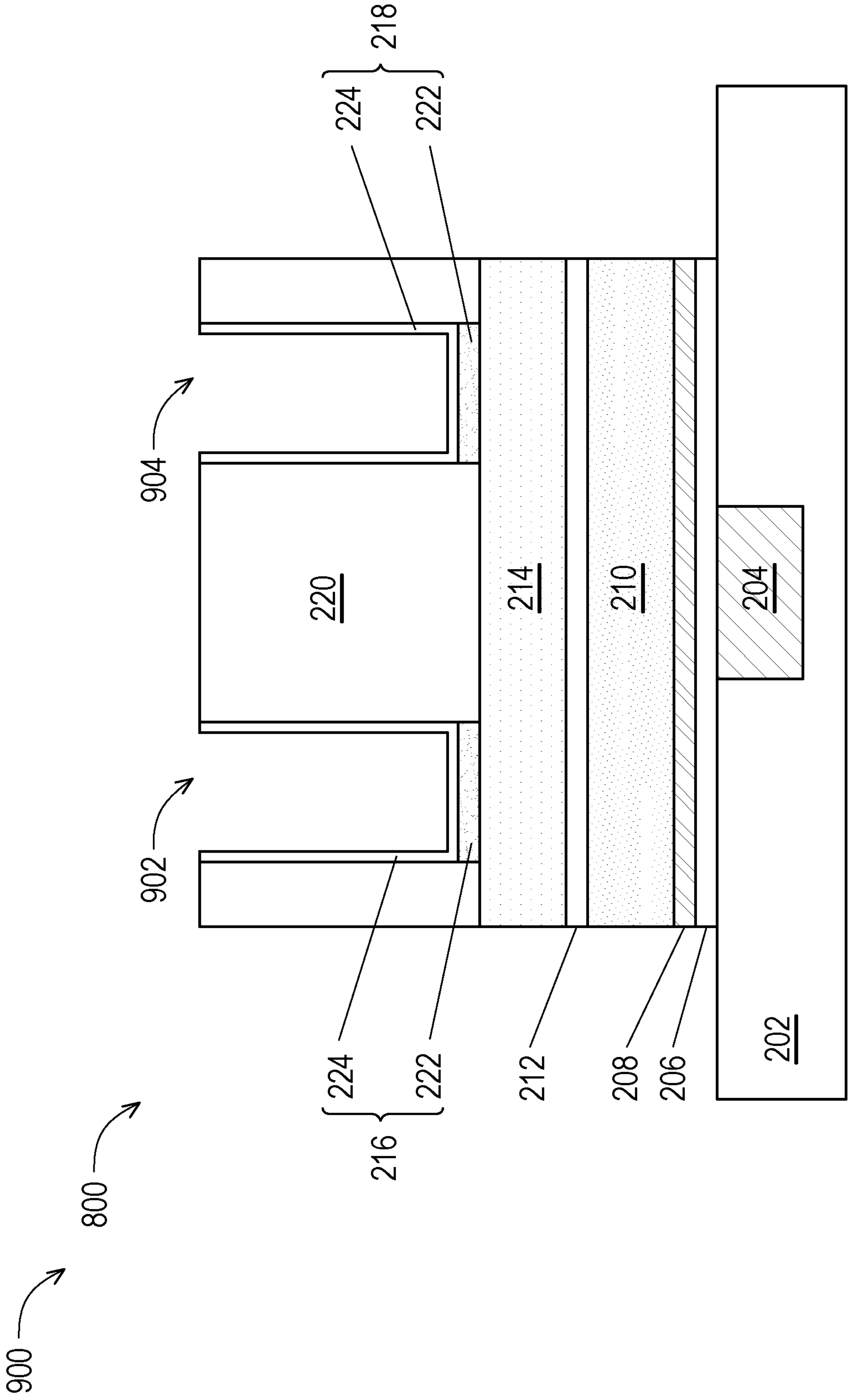

As shown in FIG. 9D, the oxide insertion layers 224 of the source/drain regions 216 and 218 may be respectively formed in the recesses 404 and 406. A deposition tool 102 may be used to conformally deposit the oxide insertion layers 224 using an ALD technique, a CVD technique, a PVD technique, another deposition technique described above in connection with FIG. 1, and/or a deposition technique other than as described above in connection with FIG. 1. The oxide insertion layers 224 may be formed on the electron barrier layers 222 over the bottom surfaces of the recesses 404 and 406. Moreover, the oxide insertion layers 224 may be formed directly on the sidewalls of the recesses 404 and 406 corresponding to the dielectric layer 220.

Figure 9E:
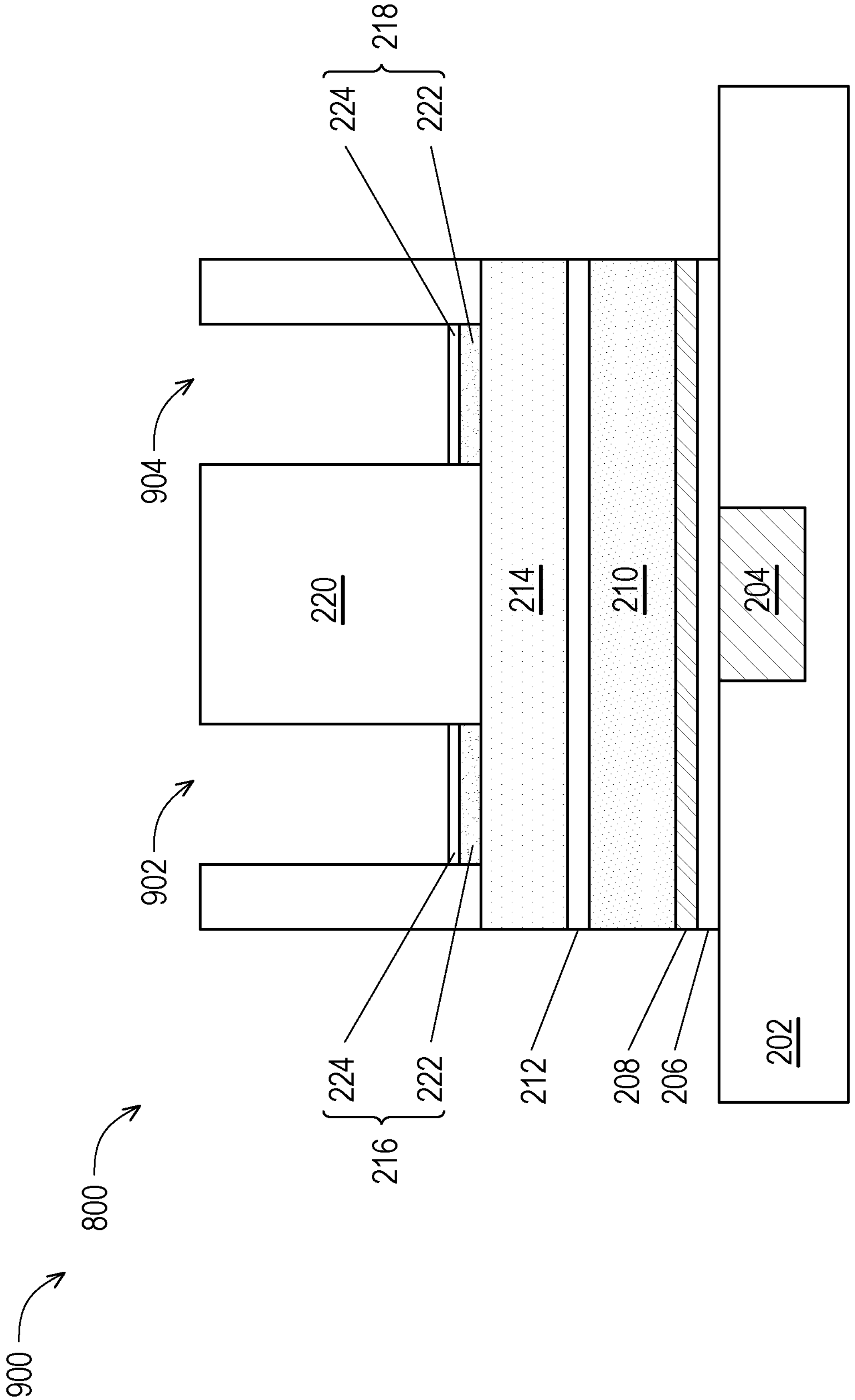

As shown in FIG. 9E, a second etch back operation may be performed to remove portions of the oxide insertion layers 224 from the sidewalls of the recesses 902 and 904. An etch tool 108 may be used to perform the second etch back operation using a plasma etch technique, a wet chemical etch technique, and/or another type of etch technique. The oxide insertion layers 224 may remain over the electron barrier layers 222 on the bottom surfaces of the recesses 902 and 904 after the second etch back operation.

Figure 9F:
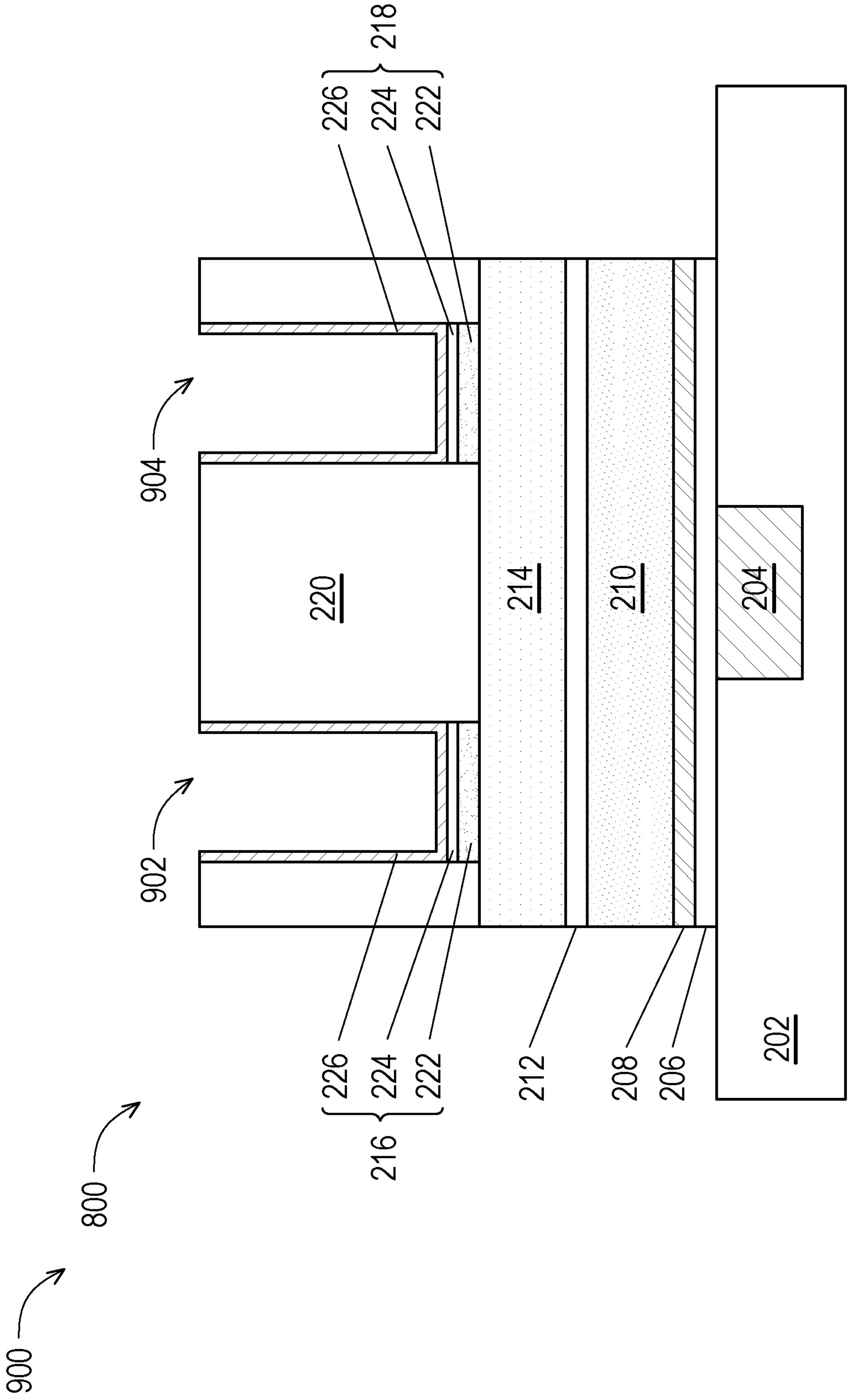

As shown in FIG. 9F, the metal glue layers 226 of the source/drain regions 216 and 218 may be respectively formed in the recesses 404 and 406. A deposition tool 102 may be used to conformally deposit the metal glue layers 226 using an ALD technique, a CVD technique, a PVD technique, another deposition technique described above in connection with FIG. 1, and/or a deposition technique other than as described above in connection with FIG. 1. The metal glue layers 226 may be formed on the oxide insertion layers 224 over the bottom surfaces of the recesses 404 and 406. Moreover, the metal glue layers 226 may be formed directly on the sidewalls of the recesses 404 and 406 corresponding to the dielectric layer 220.

Figure 9G:
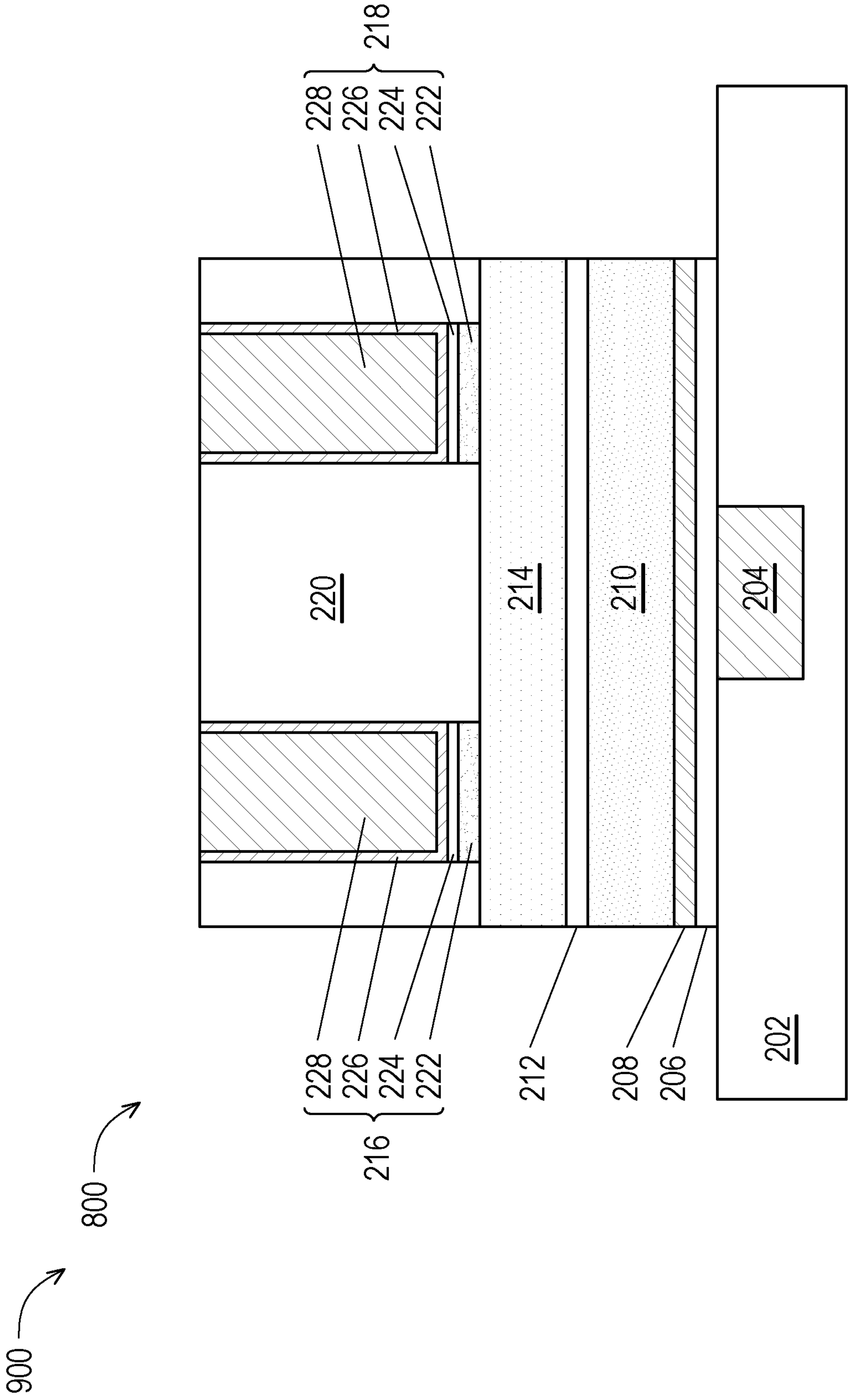

As shown in FIG. 9G, the source/drain electrodes 228 of the source/drain regions 216 and 218 may be respectively formed in the recesses 404 and 406. A deposition tool 102 and/or a plating tool 112 may be used to deposit the source/drain electrodes 228 using a CVD technique, a PVD technique, an ALD technique, an electroplating technique, another deposition technique described above in connection with FIG. 1, and/or another suitable deposition technique. The source/drain electrodes 228 may fill the remaining area of the recesses 404 and 406. In some implementations, the planarization tool 110 may be used to planarize the source/drain electrodes 228 after the source/drain electrodes 228 are deposited. In some implementations, the quasi-ALD technique described in connection with FIG. 4N and/or the non-quasi-ALD CVD technique described in connection with FIG. 4O may be used to form the source/drain electrodes 228

As indicated above, FIGS. 9A-9G are provided as an example. Other examples may differ from what is described with regard to FIGS. 9A-9G.

Figure 10:
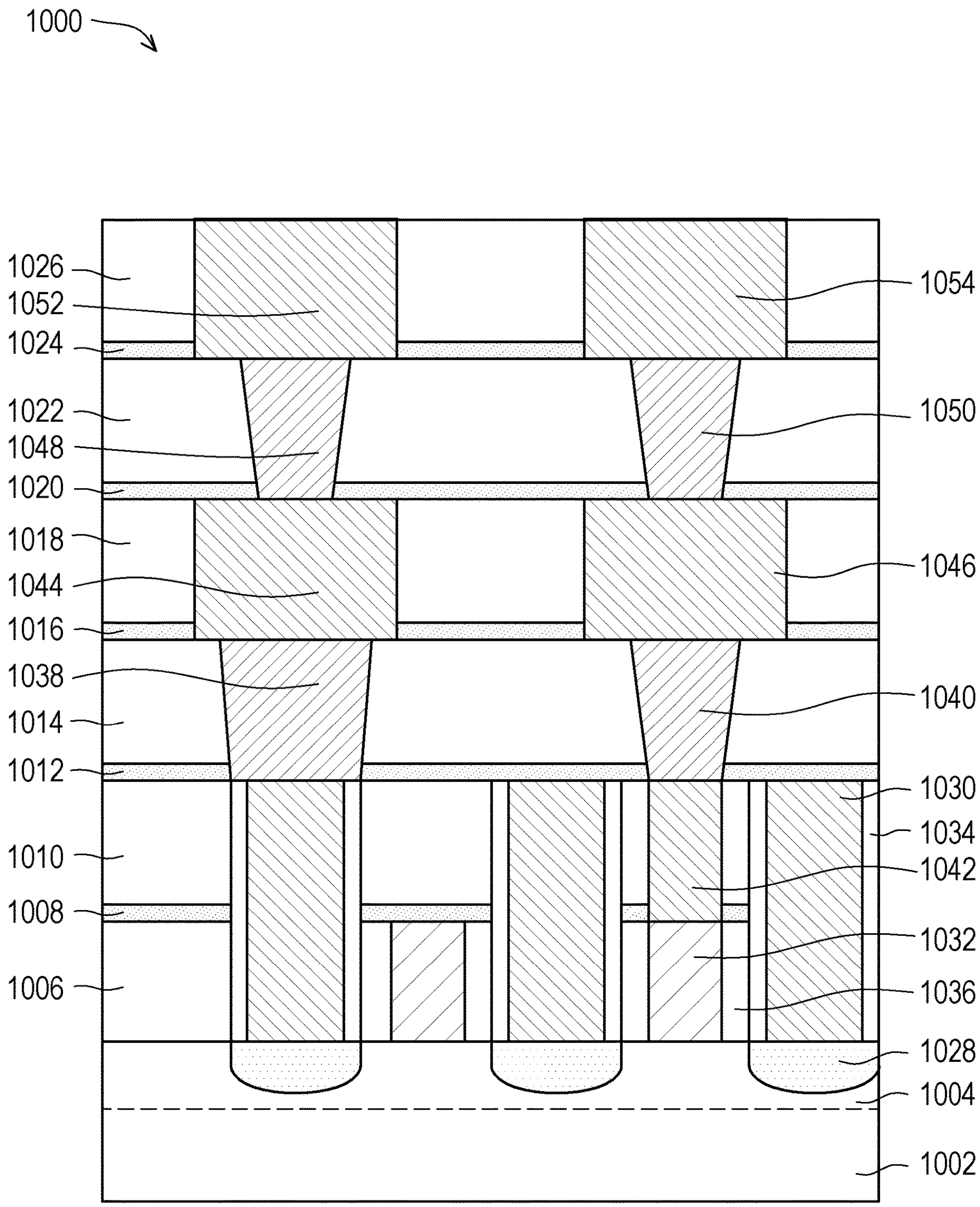
FIG. 10 is a diagram of a portion of an example semiconductor device described herein.

FIG. 10 is a diagram of a portion of an example semiconductor device 1000 described herein. The semiconductor device 1000 includes an example of a memory device (e.g., a static random access memory (SRAM), a dynamic random access memory (DRAM)), a logic device, a processor, an input/output device, or another type of semiconductor device that includes one or more transistors.

The semiconductor device 1000 includes a substrate 1002 and one or more fin structures 1004 formed above the substrate 1002. The semiconductor device 1000 includes one or more stacked layers, including a dielectric layer 1006, a dielectric layer 1008, an etch stop layer (ESL) 1008, a dielectric layer 1010, an ESL 1012, a dielectric layer 1014, an ESL 1016, a dielectric layer 1018, an ESL 1020, a dielectric layer 1022, an ESL 1024, and a dielectric layer 1026, among other examples. The dielectric layers 1006, 1010, 1014, 1018, 1022, and 1026 are included to electrically isolate various structures of the semiconductor device 1000. The dielectric layers 1006, 1010, 1014, 1018, 1022, and 1026 include a silicon nitride ($SiN_x$), an oxide (e.g., a silicon oxide ($SiO_x$) and/or another oxide material), and/or another type of dielectric material. The ESLs 1008, 1012, 1016, 1020, 1024 includes a layer of material that is configured to permit various portions of the semiconductor device 1000 (or the layers included therein) to be selectively etched or protected from etching to form one or more of the structures included in the semiconductor device 1000.

As further shown in FIG. 10, the semiconductor device 1000 includes a plurality of epitaxial (epi) regions 1028 that are grown and/or otherwise formed on and/or around portions of the fin structure 1004. The epitaxial regions 1028 are formed by epitaxial growth. In some implementations, the epitaxial regions 1028 are formed in recessed portions in the fin structure 1004. The recessed portions may be formed by strained source drain (SSD) etching of the fin structure 1004 and/or another type etching operation. The epitaxial regions 1028 function as source or drain regions of the transistors included in the semiconductor device 1000.

The epitaxial regions 1028 are electrically connected to metal source or drain contacts 1030 of the transistors included in the semiconductor device 1000. The metal source or drain contacts (MDs or CAs) 1030 include cobalt (Co), ruthenium (Ru), and/or another conductive or metal material. The transistors further include gates 1032 (MGs), which are formed of a polysilicon material, a metal (e.g., tungsten (W) or another metal), and/or another type of conductive material. The metal source or drain contacts 1030 and the gates 1032 are electrically isolated by one or more sidewall spacers, including spacers 1034 in each side of the metal source or drain contacts 1030 and spacers 1036 on each side of the gate 1032. The spacers 1034 and 1036 include a silicon oxide ($SiO_x$), a silicon nitride ($Si_xN_y$), a silicon oxy carbide (SiOC), a silicon oxycarbonitride (SiOCN), and/or another suitable material. In some implementations, the spacers 1034 are omitted from the sidewalls of the source or drain contacts 1030.

As further shown in FIG. 10, the metal source or drain contacts 1030 and the gates 1032 are electrically connected to one or more types of interconnects. The interconnects electrically connect the transistors of the semiconductor device 1000 and/or electrically connect the transistors to other areas and/or components of the semiconductor device 1000. In some implementations, the interconnects electrically connect the transistors to a back end of line (BEOL) region of the semiconductor device 1000.

The metal source or drain contacts 1030 are electrically connected to source or drain interconnects 1038 (e.g., source/drain vias or VDs). One or more of the gates 1032 are electrically connected to gate interconnects 1040 (e.g., gate vias or VGs). The interconnects 1038 and 1040 include a conductive material such as tungsten, cobalt, ruthenium, copper, and/or another type of conductive material. In some implementations, the gates 1032 are electrically connected to the gate interconnects 1040 by gate contacts 1042 (CB or MP) to reduce contact resistance between the gates 1032 and the gate interconnects 1040. The gate contacts 1042 include tungsten (W), cobalt (Co), ruthenium (Ru), titanium (Ti), aluminum (Al), copper (Cu) or gold (Au), among other examples of conductive materials.

As further shown in FIG. 10, the interconnects 1038 and 1040 are electrically connected to a plurality of BEOL layers, each including one or more metallization layers and/or vias. As an example, the interconnects 1038 and 1040 may be electrically connected to an M0 metallization layer that includes conductive structures 1044 and 1046. The M0 metallization layer is electrically connected to a V0 via layer that includes vias 1048 and 1050. The V0 via layer is electrically connected to an M1 metallization that includes conductive structures 1052 and 1054. In some implementations, the BEOL layers of the semiconductor device 1000 includes additional metallization layers and/or vias that connect the semiconductor device 1000 to a package.

One or more non-volatile memory cell structures 200 and/or non-volatile memory cell structures 800 may be included in the BEOL region of the semiconductor device 1000. For example, a non-volatile memory cell structure 200 and/or a non-volatile memory cell structure 800 may be included in one or more of the BEOL layers of the semiconductor device 1000. In these examples, the non-volatile memory cell structure 200 and/or the non-volatile memory cell structure 800 may be included in one or more of the dielectric layers 1010, 1014, 1018, 1022, 1026, and/or another dielectric layer in the BEOL region of the semiconductor device 1000. Moreover, the non-volatile memory cell structure 200 and/or the non-volatile memory cell structure 800 may be electrically connected with one or more of the conductive structures 1044, 1046, 1052, 1054, and/or another conductive structure in the BEOL region of the semiconductor device 1000; and/or may be electrically connected with one or more of the vias 1048, 1050, and/or another via in the BEOL region of the semiconductor device 1000.

As indicated above, FIG. 10 is provided as an example. Other examples may differ from what is described with regard to FIG. 10.

Figure 11:
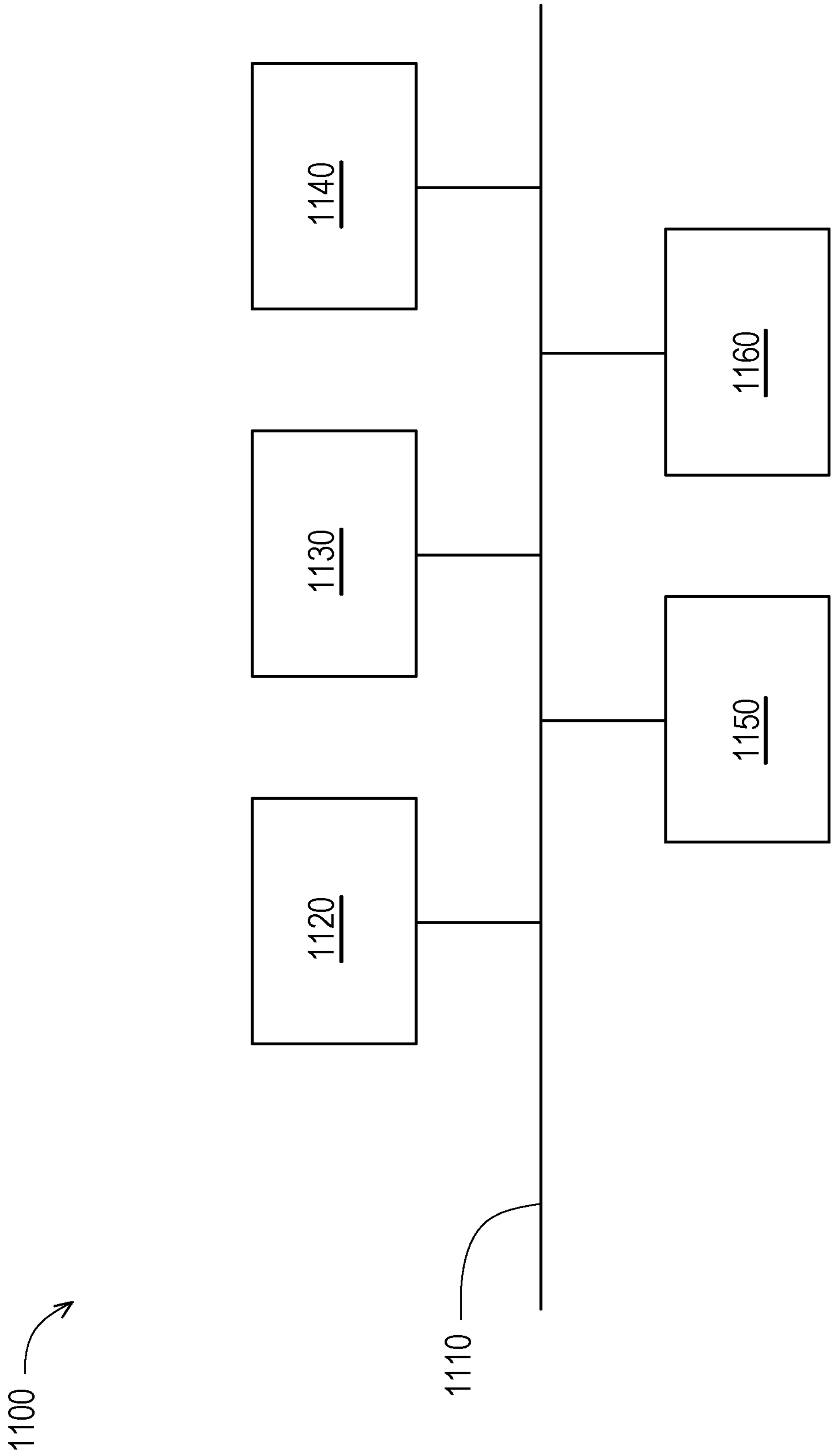
FIG. 11 is a diagram of example components of a device described herein.

FIG. 11 is a diagram of example components of a device 1100 described herein. In some implementations, one or more of the semiconductor processing tools 102-112 and/or the wafer/die transport tool 114 may include one or more devices 1100 and/or one or more components of the device 1100. As shown in FIG. 11, the device 1100 may include a bus 1110, a processor 1120, a memory 1130, an input component 1140, an output component 1150, and/or a communication component 1160.

The bus 1110 may include one or more components that enable wired and/or wireless communication among the components of the device 1100. The bus 1110 may couple together two or more components of FIG. 11, such as via operative coupling, communicative coupling, electronic coupling, and/or electric coupling. For example, the bus 1110 may include an electrical connection (e.g., a wire, a trace, and/or a lead) and/or a wireless bus. The processor 1120 may include a central processing unit, a graphics processing unit, a microprocessor, a controller, a microcontroller, a digital signal processor, a field-programmable gate array, an application-specific integrated circuit, and/or another type of processing component. The processor 1120 may be implemented in hardware, firmware, or a combination of hardware and software. In some implementations, the processor 1120 may include one or more processors capable of being programmed to perform one or more operations or processes described elsewhere herein.

The memory 1130 may include volatile and/or nonvolatile memory. For example, the memory 1130 may include random access memory (RAM), read only memory (ROM), a hard disk drive, and/or another type of memory (e.g., a flash memory, a magnetic memory, and/or an optical memory). The memory 1130 may include internal memory (e.g., RAM, ROM, or a hard disk drive) and/or removable memory (e.g., removable via a universal serial bus connection). The memory 1130 may be a non-transitory computer-readable medium. The memory 1130 may store information, one or more instructions, and/or software (e.g., one or more software applications) related to the operation of the device 1100. In some implementations, the memory 1130 may include one or more memories that are coupled (e.g., communicatively coupled) to one or more processors (e.g., processor 1120), such as via the bus 1110. Communicative coupling between a processor 1120 and a memory 1130 may enable the processor 1120 to read and/or process information stored in the memory 1130 and/or to store information in the memory 1130.

The input component 1140 may enable the device 1100 to receive input, such as user input and/or sensed input. For example, the input component 1140 may include a touch screen, a keyboard, a keypad, a mouse, a button, a microphone, a switch, a sensor, a global positioning system sensor, a global navigation satellite system sensor, an accelerometer, a gyroscope, and/or an actuator. The output component 1150 may enable the device 1100 to provide output, such as via a display, a speaker, and/or a light-emitting diode. The communication component 1160 may enable the device 1100 to communicate with other devices via a wired connection and/or a wireless connection. For example, the communication component 1160 may include a receiver, a transmitter, a transceiver, a modem, a network interface card, and/or an antenna.

The device 1100 may perform one or more operations or processes described herein. For example, a non-transitory computer-readable medium (e.g., memory 1130) may store a set of instructions (e.g., one or more instructions or code) for execution by the processor 1120. The processor 1120 may execute the set of instructions to perform one or more operations or processes described herein. In some implementations, execution of the set of instructions, by one or more processors 1120, causes the one or more processors 1120 and/or the device 1100 to perform one or more operations or processes described herein. In some implementations, hardwired circuitry may be used instead of or in combination with the instructions to perform one or more operations or processes described herein. Additionally, or alternatively, the processor 1120 may be configured to perform one or more operations or processes described herein. Thus, implementations described herein are not limited to any specific combination of hardware circuitry and software.

The number and arrangement of components shown in FIG. 11 are provided as an example. The device 1100 may include additional components, fewer components, different components, or differently arranged components than those shown in FIG. 11. Additionally, or alternatively, a set of components (e.g., one or more components) of the device 1100 may perform one or more functions described as being performed by another set of components of the device 1100.

Figure 12:
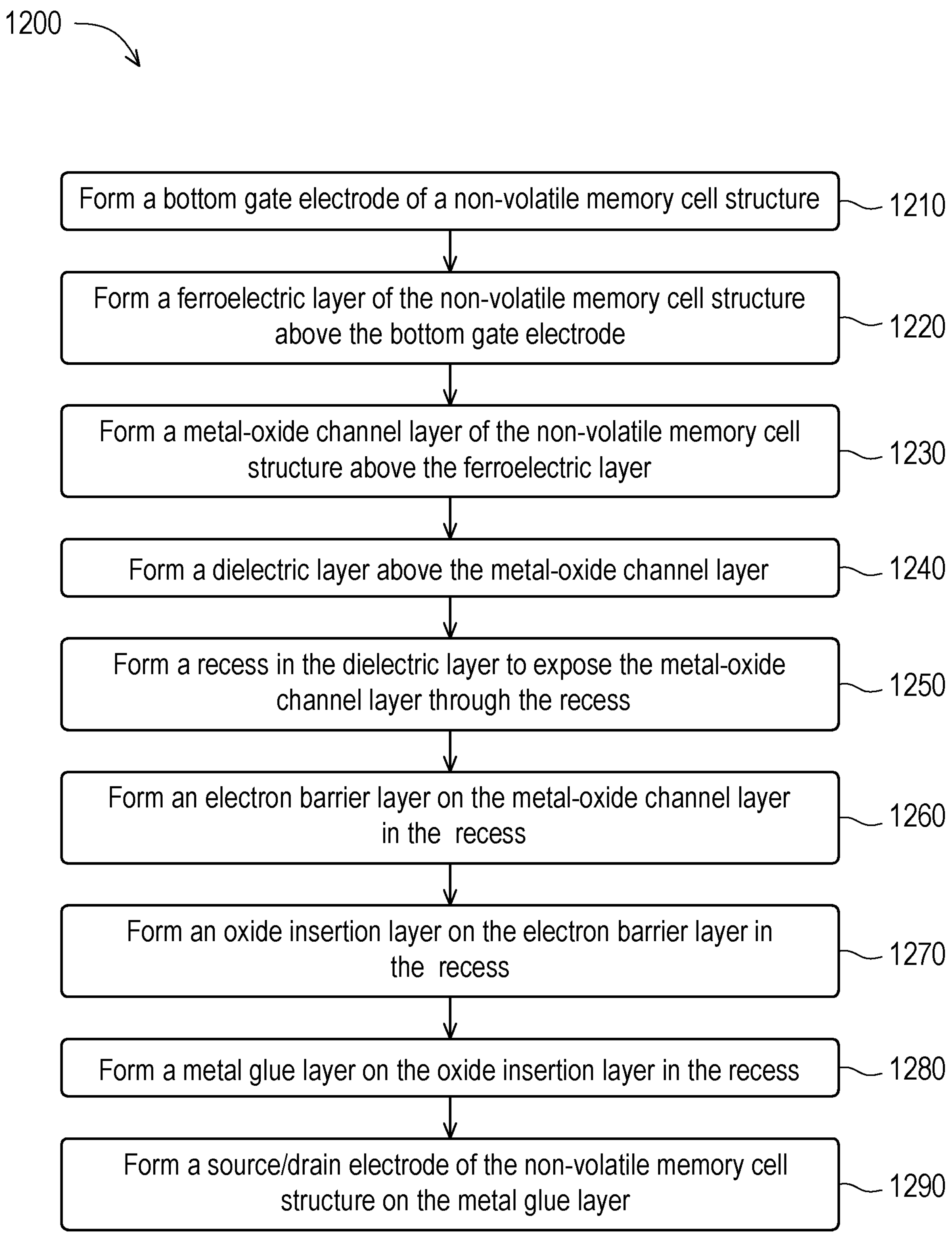
FIG. 12 is a flowchart of an example process associated with forming a ferroelectric non-volatile memory described herein.

FIG. 12 is a flowchart of an example process 1200 associated with forming a ferroelectric non-volatile memory described herein. In some implementations, one or more process blocks of FIG. 12 are performed using one or more semiconductor processing tools (e.g., one or more of the semiconductor processing tools 102-112). Additionally, or alternatively, one or more process blocks of FIG. 12 may be performed using one or more components of device 1100, such as processor 1120, memory 1130, input component 1140, output component 1150, and/or communication component 1160.

As shown in FIG. 12, process 1200 may include forming a bottom gate electrode of a non-volatile memory cell structure (block 1210). For example, one or more of the semiconductor processing tools 102-112 may be used to form a bottom gate electrode 204 of a non-volatile memory cell structure (e.g., a non-volatile memory cell structure 200, a non-volatile memory cell structure 800), as described herein.

As further shown in FIG. 12, process 1200 may include forming a ferroelectric layer (210) of the non-volatile memory cell structure above the bottom gate electrode (block 1220). For example, one or more of the semiconductor processing tools 102-112 may be used to form a ferroelectric layer 210 of the non-volatile memory cell structure above the bottom gate electrode 204, as described herein.

As further shown in FIG. 12, process 1200 may include forming a metal-oxide channel layer of the non-volatile memory cell structure above the ferroelectric layer (block 1230). For example, one or more of the semiconductor processing tools 102-112 may be used to form a metal-oxide channel layer 214 of the non-volatile memory cell structure above the ferroelectric layer 210, as described herein.

As further shown in FIG. 12, process 1200 may include forming a dielectric layer above the metal-oxide channel layer (block 1240). For example, one or more of the semiconductor processing tools 102-112 may be used to form a dielectric layer 220 above the metal-oxide channel layer 214, as described herein.

As further shown in FIG. 12, process 1200 may include forming a recess in the dielectric layer to expose the metal-oxide channel layer through the recess (block 1250). For example, one or more of the semiconductor processing tools 102-112 may be used to form a recess 404 in the dielectric layer 220 to expose the metal-oxide channel layer 214 through the recess 404, as described herein.

As further shown in FIG. 12, process 1200 may include forming an electron barrier layer on the metal-oxide channel layer in the recess (block 1260). For example, one or more of the semiconductor processing tools 102-112 may be used to form an electron barrier layer 222 on the metal-oxide channel layer 214 in the recess 404, as described herein.

As further shown in FIG. 12, process 1200 may include forming an oxide insertion layer on the electron barrier layer in the recess (block 1270). For example, one or more of the semiconductor processing tools 102-112 may be used to form an oxide insertion layer 224 on the electron barrier layer 222 in the recess 404, as described herein.

As further shown in FIG. 12, process 1200 may include forming a metal glue layer on the oxide insertion layer in the recess (block 1280). For example, one or more of the semiconductor processing tools 102-112 may be used to form a metal glue layer 226 on the oxide insertion layer 224 in the recess 404, as described herein.

As further shown in FIG. 12, process 1200 may include forming a source/drain electrode of the non-volatile memory cell structure on the metal glue layer (block 1290). For example, one or more of the semiconductor processing tools 102-112 may be used to form a source/drain electrode 228 of the non-volatile memory cell structure on the metal glue layer 226, as described herein.

Process 1200 may include additional implementations, such as any single implementation or any combination of implementations described below and/or in connection with one or more other processes described elsewhere herein.

In a first implementation, forming the source/drain electrode 228 includes performing a chemical vapor deposition operation to deposit the source/drain electrode 228 in the recess 404 using a metal precursor gas supply 408, where the metal precursor gas supply 408 is pulsed during the chemical vapor deposition operation.

In a second implementation, alone or in combination with the first implementation, forming the source/drain electrode 228 includes performing a chemical vapor deposition operation to deposit the source/drain electrode 228 in the recess 404 using a metal precursor gas supply 408, where the metal precursor gas supply 408 is pulsed for a plurality of precursor gas pulse durations 414 during the chemical vapor deposition operation, and where the plurality of precursor gas pulse durations 414 are spaced apart in time by a plurality of nitrogen ($N_2$) gas purges 416 in which a nitrogen gas supply 410 is used to purge the metal precursor gas supply 408.

In a third implementation, alone or in combination with one or more of the first and second implementations, a ratio of a time duration of a nitrogen gas purge 416 of the plurality of nitrogen gas purges 416 to a time duration of a precursor gas pulse duration 414 of the plurality of precursor gas pulse durations 414 is included in a range of approximately 5:3 to approximately 20:1.

In a fourth implementation, alone or in combination with one or more of the first through third implementations, a hydrogen ($H_2$) reactant gas 412 is continuously supplied across the plurality of precursor gas pulse durations 414 and the plurality of nitrogen gas purges 416.

In a fifth implementation, alone or in combination with one or more of the first through fourth implementations, forming the source/drain electrode 228 includes performing a first chemical vapor deposition operation to deposit a first portion of the source/drain electrode 228 in the recess 404 using a metal precursor gas supply 408, where the metal precursor gas supply 408 is pulsed during the first chemical vapor deposition operation, and performing a second chemical vapor deposition operation to deposit a second portion of the source/drain electrode 228 in the recess 404 over the first portion, where the metal precursor gas supply 408 is continuously supplied during the second chemical vapor deposition operation.

In a sixth implementation, alone or in combination with one or more of the first through fifth implementations, a crystal grain size of the first portion is greater than a crystal grain size of the second portion.

In a seventh implementation, alone or in combination with one or more of the first through sixth implementations, forming the electron barrier layer comprises forming the electron barrier layer on sidewalls of the recess, wherein forming the oxide insertion layer comprises forming the oxide insertion layer on the electron barrier layer on the sidewalls of the recess, and wherein forming the metal glue layer comprises forming the metal glue layer on the oxide insertion layer on the sidewalls of the recess.

In an eighth implementation, alone or in combination with one or more of the first through seventh implementations, forming the electron barrier layer comprises forming the electron barrier layer on sidewalls of the recess, and performing an etch operation to remove the electron barrier layer from the sidewalls of the recess such that the electron barrier layer remains on only the metal-oxide channel layer in the recess, and wherein forming the oxide insertion layer comprises forming the oxide insertion layer on the sidewalls of the recess.

In a ninth implementation, alone or in combination with one or more of the first through eighth implementations, forming the oxide insertion layer comprises performing another etch operation to remove the oxide insertion layer from the sidewalls of the recess such that the oxide insertion layer remains on only the electron barrier layer in the recess.

In a tenth implementation, alone or in combination with one or more of the first through ninth implementations, forming the metal glue layer comprises forming the metal glue layer on the sidewalls of the recess, and wherein forming the source/drain electrode comprises forming the source/drain electrode such that the metal glue is between the source/drain electrode and the sidewalls of the recess.

Although FIG. 12 shows example blocks of process 1200, in some implementations, process 1200 includes additional blocks, fewer blocks, different blocks, or differently arranged blocks than those depicted in FIG. 12. Additionally, or alternatively, two or more of the blocks of process 1200 may be performed in parallel.

In this way, an FeRAM cell may include an oxide insertion layer between the electron barrier layer and the metal glue layer of the source/drain regions of the FeRAM cell. The oxide insertion layer may improve the thermal stability of the electron barrier layer and minimize or prevent dissociation and/or out-diffusion of the electron barrier layer at high processing temperatures. Thus, the oxide insertion layer may enable the metal glue layer to be formed over the electron barrier layer with low surface roughness, which may enable increased adhesion between the metal glue layer and the source/drain electrodes of the source/drain regions. In this way, the oxide insertion layer may enable low electrical resistance to be achieved for the FeRAM cell and/or may reduce the likelihood of failures in the FeRAM cell, among other examples.

As described in greater detail above, some implementations described herein provide a non-volatile memory cell structure. The non-volatile memory cell structure includes a bottom gate electrode. The non-volatile memory cell structure includes a memory layer above the bottom gate electrode. The non-volatile memory cell structure includes a metal-oxide channel layer above the memory layer. The non-volatile memory cell structure includes a plurality of source/drain regions in a dielectric layer above the metal-oxide channel layer, where a source/drain region of the plurality of source/drain regions, includes an electron barrier layer on the metal-oxide channel layer, an oxide insertion layer on the electron barrier layer, a metal glue layer on the oxide insertion layer, and a source/drain electrode on the metal glue layer.

As described in greater detail above, some implementations described herein provide a method. The method includes forming a bottom gate electrode of a non-volatile memory cell structure. The method includes forming a ferroelectric layer of the non-volatile memory cell structure above the bottom gate electrode. The method includes forming a metal-oxide channel layer of the non-volatile memory cell structure above the ferroelectric layer. The method includes forming a dielectric layer above the metal-oxide channel layer. The method includes forming a recess in the dielectric layer to expose the metal-oxide channel layer through the recess. The method includes forming an electron barrier layer on the metal-oxide channel layer in the recess. The method includes forming an oxide insertion layer on the electron barrier layer in the recess. The method includes forming a metal glue layer on the oxide insertion layer in the recess. The method includes forming a source/drain electrode of the non-volatile memory cell structure on the metal glue layer.

As described in greater detail above, some implementations described herein provide a non-volatile memory cell structure. The non-volatile memory cell structure includes a seed layer. The non-volatile memory cell structure includes a ferroelectric layer above the seed layer. The non-volatile memory cell structure includes a metal-oxide channel layer above the ferroelectric layer. The non-volatile memory cell structure includes a plurality of source/drain regions in a dielectric layer above the metal-oxide channel layer, where a source/drain region of the plurality of source/drain regions, includes an electron barrier layer on the metal-oxide channel layer an oxide insertion layer on the electron barrier layer, a metal glue layer on the oxide insertion layer, and a source/drain electrode on the metal glue layer.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A non-volatile memory cell structure, comprising:
- a bottom gate electrode;
- a memory layer above the bottom gate electrode;
- a metal-oxide channel layer above the memory layer; and
- a plurality of source/drain regions in a dielectric layer above the metal-oxide channel layer,
  - wherein a source/drain region of the plurality of source/drain regions comprises:
    - an electron barrier layer on the metal-oxide channel layer;
    - an oxide insertion layer directly on the electron barrier layer;
    - a metal glue layer directly on the oxide insertion layer, wherein the oxide insertion layer is directly between the electron barrier layer and the metal glue layer; and
    - a source/drain electrode on the metal glue layer.

2. The non-volatile memory cell structure of claim 1, wherein the oxide insertion layer comprises an oxide-semiconductor material.

3. The non-volatile memory cell structure of claim 1, wherein the oxide insertion layer comprises a metal-oxide material.

4. The non-volatile memory cell structure of claim 1, wherein the oxide insertion layer comprises a high dielectric constant dielectric material.

5. The non-volatile memory cell structure of claim 1, wherein a thickness of the oxide insertion layer is included in a range of approximately 0.5 angstroms to approximately 5 nanometers.

6. A non-volatile memory cell structure, comprising:
- a seed layer;
- a ferroelectric layer above the seed layer;
- a metal-oxide channel layer above the ferroelectric layer, and
- a plurality of source/drain regions in a dielectric layer above the metal-oxide channel layer,
  - wherein a source/drain region of the plurality of source/drain regions comprises:
    - an electron barrier layer on the metal-oxide channel layer;
    - an oxide insertion layer directly on the electron barrier layer;
    - a metal glue layer directly on the oxide insertion layer; and
    - a source/drain electrode on the metal glue layer.

7. The non-volatile memory cell structure of claim 6, wherein the oxide insertion layer comprises at least one of:
- gallium oxide (GaO),
- silicon oxide ($SiO_x$),
- hafnium oxide ($HfO_x$),
- aluminum oxide ($Al_xO_y$), or
- zirconium oxide ($ZrO_x$).

8. The non-volatile memory cell structure of claim 6, wherein the metal glue layer is further located between, and in contact with, sidewalls of the source/drain electrode and the dielectric layer.

9. The non-volatile memory cell structure of claim 6, wherein the electron barrier layer, the oxide insertion layer, and the metal glue layer are further located between sidewalls of the source/drain electrode and the dielectric layer.

10. A non-volatile memory cell structure, comprising:

a ferroelectric layer above a bottom gate electrode;

a metal-oxide channel layer above the ferroelectric layer;

a dielectric layer above the metal-oxide channel layer;

an electron barrier layer on the metal-oxide channel layer in a recess of the dielectric layer;

an oxide insertion layer directly on the electron barrier layer;

a metal glue layer directly on the oxide insertion layer, wherein the oxide insertion layer is directly between the electron barrier layer and the metal glue layer; and a source/drain electrode on the metal glue layer.

11. The non-volatile memory cell structure of claim 10, wherein at least one of the electron barrier layer, the oxide insertion layer, or the metal glue layer are formed on sidewalls of the recess.

12. The non-volatile memory cell structure of claim 11, wherein each of the electron barrier layer, the oxide insertion layer, and the metal glue layer are formed on the sidewalls of the recess.

13. The non-volatile memory cell structure of claim 11, wherein the electron barrier layer is formed directly on sidewalls of the recess.

14. The non-volatile memory cell structure of claim 13, wherein the electron barrier layer is further formed directly on a bottom surface of the recess.

15. The non-volatile memory cell structure of claim 11, wherein the metal glue layer is formed between the source/drain electrode and the sidewalls of the recess.

16. The non-volatile memory cell structure of claim 10, wherein the oxide insertion layer comprises an oxide-semiconductor material.

17. The non-volatile memory cell structure of claim 10, wherein the oxide insertion layer comprises a metal-oxide material.

18. The non-volatile memory cell structure of claim 10, wherein the source/drain electrode resides directly on the metal glue layer.

19. The non-volatile memory cell structure of claim 10, wherein the electron barrier layer, the oxide insertion layer, the metal glue layer, and the source/drain electrode reside in the recess.

20. The non-volatile memory cell structure of claim 10, wherein the electron barrier layer, the oxide insertion layer, the metal glue layer, and the source/drain electrode further reside in a second recess of the dielectric layer.

* * * * *